United States Patent
Funato et al.

(10) Patent No.: US 9,960,779 B2
(45) Date of Patent: May 1, 2018

(54) ANALOG TO DIGITAL CONVERSION CIRCUIT

(71) Applicant: Renesas Electronics Corporation, Tokyo (JP)

(72) Inventors: Yoshihiro Funato, Kodaira (JP); Yasuo Morimoto, Kodaira (JP); Kazuaki Kurooka, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/799,034

(22) Filed: Oct. 31, 2017

(65) Prior Publication Data

US 2018/0069563 A1    Mar. 8, 2018

Related U.S. Application Data

(63) Continuation of application No. 15/615,719, filed on Jun. 6, 2017, now Pat. No. 9,838,027, which is a
(Continued)

(30) Foreign Application Priority Data

Jan. 6, 2016 (JP) ................. 2016-000824

(51) Int. Cl.
    *H03M 1/06* (2006.01)
    *H03M 1/12* (2006.01)
    *H03M 1/10* (2006.01)

(52) U.S. Cl.
    CPC ....... *H03M 1/0617* (2013.01); *H03M 1/1023* (2013.01); *H03M 1/12* (2013.01)

(58) Field of Classification Search
    CPC .... H03M 1/0617; H03M 1/1023; H03M 1/12; H03M 1/0678; H03M 1/0682; H03M 1/468
    (Continued)

(56) References Cited

U.S. PATENT DOCUMENTS 6,369,744 B1   4/2002   Chuang
7,605,741 B2   10/2009  Hurrell
(Continued)

FOREIGN PATENT DOCUMENTS

JP    2004-222274 A    8/2004

OTHER PUBLICATIONS

S. Y. Chuang and T. L. Sculley, "A digitally self-calibrating 14-bit 10-MHz CMOS pipelined A/D converter", Journal of Solid-State Circuits, vol. 37, No. 6, Jun. 2002.
(Continued)

*Primary Examiner* — Khai M Nguyen
(74) *Attorney, Agent, or Firm* — McGinn IP Law Group, PLLC

(57) ABSTRACT

An analog-to-digital (AD) convertor includes: an AD conversion circuit; and a correction circuit that corrects an output value of the AD conversion circuit based on a correction value, wherein the correction circuit generates a plurality of elemental correction values based on a plurality of output values which are converted values of a plurality of analog values by the AD conversion circuit, wherein the correction value is determined by an average value of remaining values obtained by removing a deviated value from the plurality of elemental correction values.

10 Claims, 30 Drawing Sheets

Related U.S. Application Data continuation of application No. 15/371,101, filed on Dec. 6, 2016, now Pat. No. 9,698,804.

(58) Field of Classification Search
USPC .................... 341/118, 120, 161, 163, 172
See application file for complete search history.

(56) References Cited

U.S. PATENT DOCUMENTS

| | | |
|---|---|---|
| 8,164,504 B2 | 4/2012 | Cho |
| 9,100,034 B2 | 8/2015 | Oshima |
| 9,124,284 B2* | 9/2015 | Kimura ............... H03M 1/0634 |
| 9,444,482 B2* | 9/2016 | Oshima ............... H03M 1/1038 |

OTHER PUBLICATIONS

S. T. Ryu, "A 14b-Linear Capacitor Self-Trimming Pipelined ADC", Journal of Solid-State Circuits, vol. 39, No. 11, Nov. 2004.
U.S. Notice of Allowance dated Aug. 15, 2017 in U.S. Appl. No. 15/615,719.
U.S. Notice of Allowance dated Feb. 21, 2017 in U.S. Appl. No. 15/371,101.

* cited by examiner

ANALOG TO DIGITAL CONVERSION CIRCUIT

CROSS-REFERENCE TO RELATED APPLICATIONS

The present application is a Continuation Application of U.S. patent application Ser. No. 15/615,719, filed on Jun. 6, 2017, which is a Continuation Application of U.S. patent application Ser. No. 15/371,101, filed on Dec. 6, 2016, now U.S. Pat. No. 9,698,804, issued on Jul. 4, 2017 which claims priority from Japanese Patent Application No. 2016-000824 filed on Jan. 6, 2016 including the specification, drawings and abstract incorporated herein by reference in its entirety.

BACKGROUND

The present invention relates to an analog to digital convertor, and in particular, can be preferably used for an analog to digital convertor accompanied by calibration.

In an analog to digital convertor (ADC), linearity caused by mismatch of elements in the ADC and a conversion error due to offset have been generally corrected using a digital calibration technique. Here, the "analog to digital convertor" is referred to an analog to digital conversion circuit, an AD convertor, an AD conversion circuit, or an ADC in some cases. Further, "AD" is written as "A/D" in some cases. Further, the "mismatch of elements" includes mismatch with respect to a design value, namely, a relative error and relative variation generated when the elements are designed to be supposed to have the same elemental value or elemental values with a specified ratio, in addition to manufacturing variation and an absolute error. In order to remove an error of a correction value generated due to noise such as elemental noise in calibration, correction values are obtained by a plurality of operations, and the final correction value is obtained by averaging the operation results of the correction values. Alternatively, the final correction value is similarly obtained in general by an operation by which the same effect can be obtained, for example, by allowing the operation results to pass through a low-pass filter or by accumulating the operation results.

Japanese Unexamined Patent Application Publication No. 2004-222274 discloses a circuit technique of correcting an error of an output voltage of a digital to analog convertor and a gain error of an amplifying circuit in a pipeline stage of a pipeline-type ADC. FIG. 2 of the literature shows an error correction data generation circuit, a DAC error correction circuit, and a gain error correction circuit, and an effect of noise can be reduced by arranging an averaging circuit on the input side or the output side of the error correction data generation circuit. It should be noted that the "digital to analog convertor" is referred to as a digital to analog conversion circuit, a DA convertor, a DA conversion circuit, or a DAC in some cases. Further, "DA" is written as "D/A" in some cases.

"S. Y. Chuang and T. L. Sculley, "A digitally self-calibrating 14-bit 10-MHz CMOS pipelined A to D converter", Journal of Solid-State Circuit, vol. 37, No. 6, June 2002" discloses a pipeline-type ADC in which an error correction circuit is provided in each stage (see FIG. 1 of the literature), and a calibration circuit coupled to the output of the ADC shown in FIG. 6 of the literature includes an averaging circuit (2048 averaging and ALU circuit).

A calibration method in which an element parameter in an analog circuit is finely adjusted by feeding back an operation result in a digital region to an analog region has been generally used. For example, there is a self-trimming circuit shown in FIG. 3 of "S. T. Ryu, "A 14b-Linear Capacitor Self-Trimming Pipelined ADC", Journal of Solid-State Circuit, vol. 39, No. 11, November 2004".

SUMMARY

As a result of examining Japanese Unexamined Patent Application Publication No. 2004-222274, "S. Y. Chuang and T. L. Sculley, "A digitally self-calibrating 14-bit 10-MHz CMOS pipelined A to D converter", Journal of Solid-State Circuit, vol. 37, No. 6, June 2002", and "S. T. Ryu, "A 14b-Linear Capacitor Self-Trimming Pipelined ADC", Journal of Solid-State Circuit, vol. 39, No. 11, November 2004", the inventors found the following new problems.

FIG. 1 is a general and conceptual block diagram of an analog to digital conversion circuit (signal processing circuit) having a function of calibrating an error generated due to variation or the like in an analog region using an operation process in a digital region. A calibration circuit 3 is coupled to the digital output of an ADC 1 into which an analog input VIN is input. The ADC 1 and the calibration circuit 3 are arranged in the analog region and the digital region, respectively, and entirely configure a signal processing circuit 9. The entire signal processing circuit 9 may be referred to as an AD convertor or AD conversion circuit having a calibration function.

The calibration circuit 3 includes a correction circuit 7, an averaging circuit 8, and a correction value operation circuit 6. In a calibration operation, a correction value is obtained from the digital output of the ADC 1 by the correction value operation circuit 6 a plurality of times to be supplied to the averaging circuit 8. The averaging circuit 8 obtains an average value, as the final correction value, from the correction values. The final correction value is held, and is used for correcting the digital output of the ADC 1 with the correction circuit 7 in a normal operation that follows.

An effect of random noise such as elemental noise in the analog region can be removed by using a value obtained by averaging the operation results of the correction value operation circuit fixed times or more as a correction value. However, in the case where the operation results of the correction value operation circuit 6 include a largely-different result due to generation of unexpected large external noise, the final correction value is deviated. FIG. 2 are explanatory diagrams each schematically showing an impact on the correction value when unexpected large external noise is generated. FIG. 2A shows a case in which noise is random noise and correction value operation results are normally distributed, and FIG. 2B shows a case in which a correction value operation result with a large error is included due to unexpected large external noise. In the case where noise in the ADC of the analog region is random noise such as elemental noise, the correction value operation results are expected to be normally distributed as shown in FIG. 2A, and a correct correction value is calculated by removing the noise by averaging. In the case where the correction value operation results having the normal distribution include a large value (the same applies to a small value) that is deviated from a value that is supposed to be a correction value due to unexpected external noise as shown in FIG. 2B, the correction value calculated by averaging includes an error deviated from a value that is supposed to be a correction value.

In order to obtain a correct correction value using the averaged result even when large external noise is generated, it is necessary to average an enormous number of correction value operation results, and a long period of time is required for calibration. Further, even in the case where unexpected external noise is frequently or periodically generated during the averaging in a long period of time, the effect cannot be removed. In particular, in foreground calibration that determines a correction value when starting the ADC 1, there is no opportunity to correct a wrong correction value, and a normal conversion result is continuously corrected using the wrong correction value. Thus, a correct conversion result cannot be obtained due to deterioration of linearity or superposition of offset on the conversion result.

It is conceivable that the calibration is performed in a noisy circumstance where external noise is largely generated in actual use, and the correction value is possibly deviated due to the unexpected external noise as described above. However, a method of excluding the effect of such unexpected noise is neither disclosed nor suggested in Japanese Unexamined Patent Application Publication No. 2004-222274, "S. Y. Chuang and T. L. Sculley, "A digitally self-calibrating 14-bit 10-MHz CMOS pipelined A to D converter", Journal of Solid-State Circuit, vol. 37, No. 6, June 2002", and "S. T. Ryu, "A 14b-Linear Capacitor Self-Trimming Pipelined ADC", Journal of Solid-State Circuit, vol. 39, No. 11, November 2004".

Means for solving such problems will be described below. However, the other problems and novel features will become apparent from the description of the specification and the accompanying drawings.

According to one embodiment, the disclosure is as follows.

Namely, provided is an analog to digital convertor including: an ADC that converts an analog value of an input signal into a digital value and outputs a converted value; and an averaging circuit that calculates a correction value by a calibration operation. The converted value is corrected and output using the correction value calculated and held by the calibration operation in a normal operation. The analog to digital convertor is configured as follows.

In the calibration operation of the analog to digital convertor, an elemental correction value on the basis of a converted value by the ADC corresponding to a predetermined analog value is supplied to the averaging circuit a plurality of times. The averaging circuit calculates the average value of the remaining elemental correction values obtained by removing, at least, the maximum value and the minimum value from the elemental correction values supplied a plurality of times, and calculates the correction value on the basis of the average value.

The following is a description of a summary of an effect obtained in the embodiment.

Namely, even in the case where converted values of an ADC include a large error due to unexpected external noise or the like during a period of a calibration operation, a correction value can be calculated by excluding the effect.

DETAILED DESCRIPTION

Figure 1:
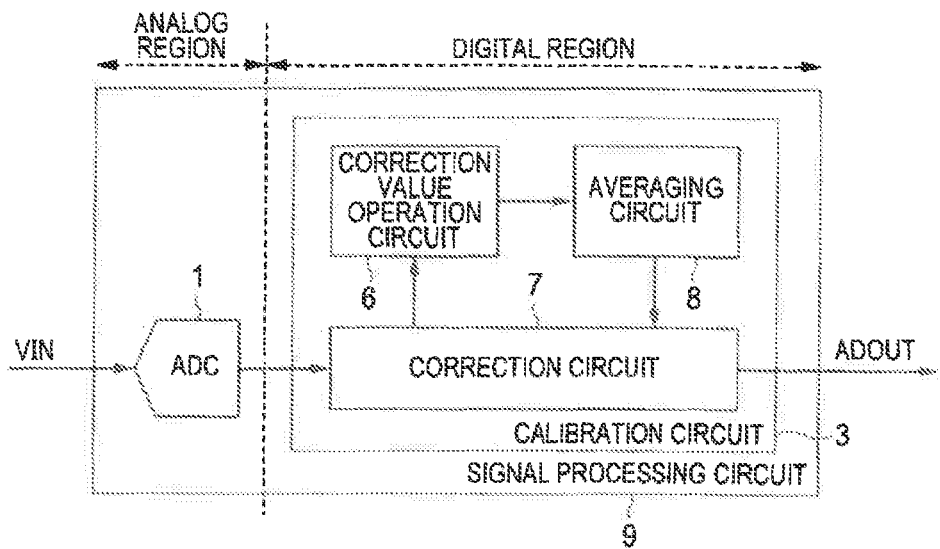
FIG. 1 is a general and conceptual block diagram of an analog to digital conversion circuit accompanied by calibration.

Embodiments will be described in detail. It should be noted that the same reference numerals are given to constitutional elements having the same functions in all the drawings for explaining the embodiments of the invention, and the explanations thereof will not be repeated.

Figure 3:
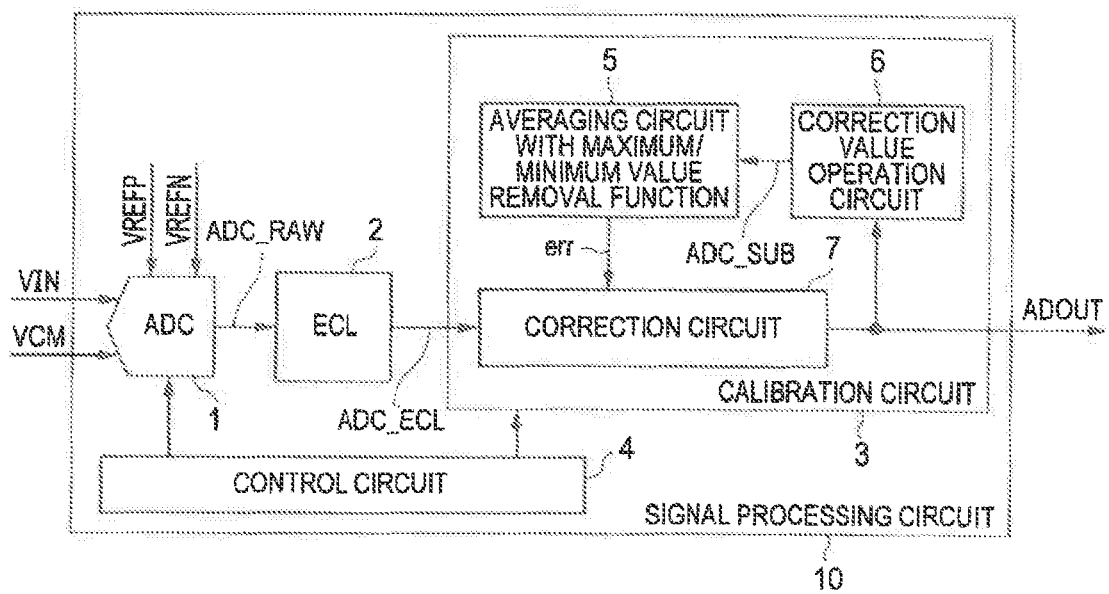
FIG. 3 is a block diagram for showing a configuration example of a signal processing circuit (AD convertor with a calibration circuit) according to a first embodiment.

[First Embodiment] AD Convertor that Performs Calibration Using an Average Value Obtained by Removing the Maximum Value and the Minimum Value FIG. 3 is a block diagram for showing a configuration example of a signal processing circuit 10 according to a first embodiment. The signal processing circuit 10 includes an AD convertor (ADC) 1, an error correction logic (ECL) 2, a calibration circuit 3, and a control circuit 4. The ADC 1 converts the voltage value of an input analog signal VIN into a digital value ADC_RAW on the basis of a standard voltage VCM and maximum/minimum reference voltages VREFP/VREFN to be output to the ECL 2. The ADC_RAW that is a conversion result of the ADC 1 includes a redundant bit, and the ECL 2 corrects conversion errors using the redundancy to be output as an ADC_ECL. The calibration circuit 3 includes a correction circuit 7, a correction value operation circuit 6, and an averaging circuit 5, and calculates and holds a correction value. The signal processing circuit 10 performs a calibration operation that obtains a correction value before starting a normal operation. The control circuit 4 controls these operations. The correction circuit 7 corrects the ADC_ECL using the correction value obtained by the calibration to be output as a conversion output ADOUT in the normal operation.

It should be noted that the lines shown in the drawing are mounted as an arbitrary number of signal lines. However, the number is not specified in the drawing, and so-called vector notation is omitted. The same applies to the other drawings in the application.

In the calibration operation, the ADC 1 outputs a conversion result corresponding to a predetermined analog signal, and the correction value operation circuit 6 calculates a correction value on the basis of the conversion result. A plurality of correction values can be obtained by repeating the operation a plurality of times. The averaging circuit 5 calculates the average value of the correction values to obtain the final correction value. The final correction value is simply referred to as a "correction value", and each of the correction values repeatedly calculated is also referred to as a "correction value". However, if there is a possibility of confusion, each correction value is referred to as an "elemental correction value". The averaging circuit 5 removes the maximum value and the minimum value from the elemental correction values, and calculates the average value of the remaining elemental correction values as the final correction value. The calculated correction value may be held by the averaging circuit 5, the correction circuit 7, or any other circuit in the calibration circuit 3, or may be held outside the calibration circuit 3.

The configuration of the signal processing circuit 10 shown in FIG. 3 shows an example in which the ADC 1 is a sequential comparison-type ADC that outputs a conversion result including a redundant bit, and the correction circuit 7 corrects the linearity of the ADC 1 due to manufacturing variation using the correction value obtained by the calibration. For example, offset as one of the other characteristics of the ADC 1 may be corrected by the calibration, or an ADC of a different system may be corrected by the calibration. In this case, an output from the correction circuit 7 need not be input into the correction value operation circuit 6 as shown in the drawing, but another signal may be added or the output may be changed to another signal. Further, the ECL 2 may be omitted. In addition, the correction circuit 7 may be changed so as to supply a correction signal that can adjust the characteristics of the ADC 1 in an analog or digital manner to the ADC 1 instead of correcting the conversion result of the ADC 1 in a digital operation process.

Thus, the essential requirement needed for the signal processing circuit 10 is as follows. Namely, the analog to digital convertor (signal processing circuit) 10 includes the ADC 1 that converts the analog value VIN of an input signal into a digital value to output the converted value, and an averaging circuit 5 that calculates a correction value in a calibration operation, and corrects the converted value using the correction value to output the converted value ADOUT after the correction. The analog to digital convertor (signal processing circuit) 10 is operated in the calibration operation as follows. The signal processing circuit 10 supplies the elemental correction value on the basis of the converted value by the ADC 1 corresponding to a predetermined analog value to the averaging circuit 5 a plurality of times, and the averaging circuit 5 calculates the correction value by calculating the average value of the remaining elemental correction values obtained by removing, at least, the maximum value and the minimum value from the elemental correction values supplied a plurality of times.

Accordingly, even in the case where the converted value of the ADC 1 includes a large error due to unexpected external noise or the like in the period of the calibration operation, the correction value can be calculated by excluding the effect.

Here, the averaging circuit 5 may average the remaining elemental correction values obtained by removing one maximum value and one minimum value from the elemental correction values, or the remaining elemental correction values obtained by removing some large elemental correction values including the maximum value and some small elemental correction values including the minimum value. Further, a plurality of final correction values or a plurality of types of final correction values used for the correction in the normal operation by the correction circuit 7 may be provided in accordance with a target of the calibration, which will be described later in detail in the latter part of the first embodiment and in the other embodiments.

The signal processing circuit 10 is formed on a single semiconductor substrate such as silicon using, for example, a manufacturing technique of a well-known CMOS (Complementary Metal-Oxide-Semiconductor field effect transistor) LSI (Large Scale Integrated circuit), but is not limited to this.

Figure 4:
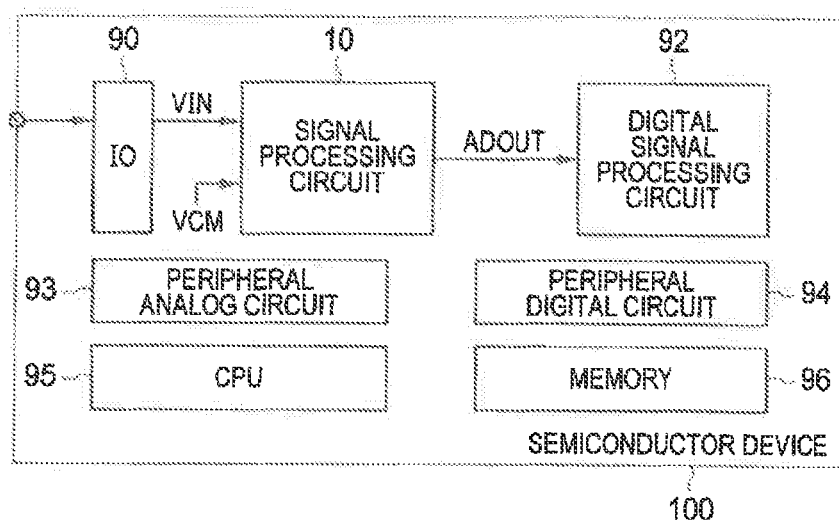
FIG. 4 is a configuration diagram for showing an example of a semiconductor device on which the signal processing circuit (AD convertor with the calibration circuit) is mounted.

FIG. 4 is a configuration diagram for showing an example of a semiconductor device 100 on which the signal processing circuit 10 is mounted. The semiconductor device 100 is, for example, an LSI formed on a single semiconductor substrate such as silicon, and includes, in addition to the signal processing circuit 10, an input/output circuit (IO) 90, a digital signal processing circuit 92, a peripheral analog circuit 93, a peripheral digital circuit 94, a CPU (Central Processing Unit) 95, and a memory 96. The analog input signal VIN is input to the signal processing circuit 10 from the outside of the semiconductor device 100 through the IO 90, and the output ADOUT of the signal processing circuit 10 is supplied to the digital signal processing circuit 92 to be input for signal processing in the subsequent stage.

Figure 5:
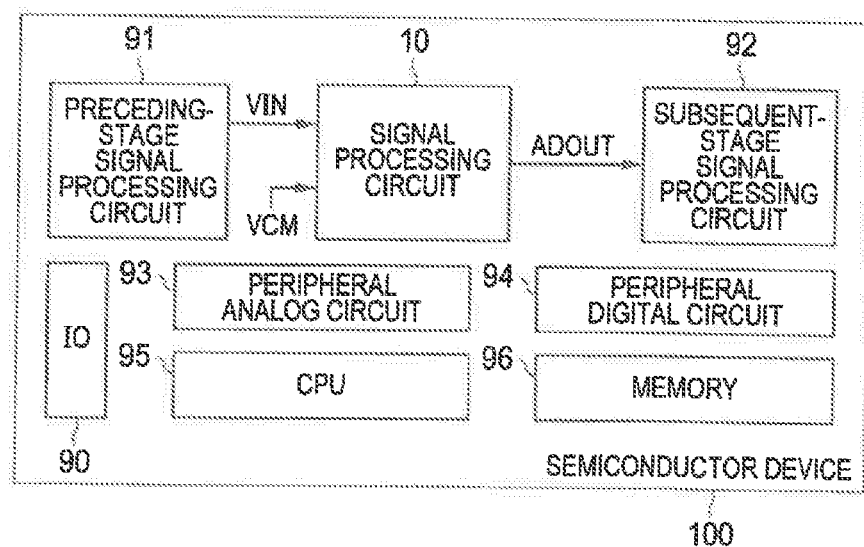
FIG. 5 is a configuration diagram for showing another example of the semiconductor device on which the signal processing circuit (AD convertor with the calibration circuit) is mounted.

FIG. 5 is a configuration diagram for showing another example of the semiconductor device 100 on which the signal processing circuit 10 is mounted. The digital signal processing circuit 92 is changed to a subsequent-stage signal processing circuit 92, and the semiconductor device 100 further includes a preceding-stage signal processing circuit 91. The VIN is input to the signal processing circuit 10 not from the outside of the semiconductor device 100 but as a signal processed by the preceding-stage signal processing circuit 91. The other configurations are the same as those in FIG. 4, and thus the explanations thereof will be omitted.

In the latter part of the first embodiment and in second to sixth embodiments, an ADC 1 of a sequential comparison system will be described.

Figure 6:
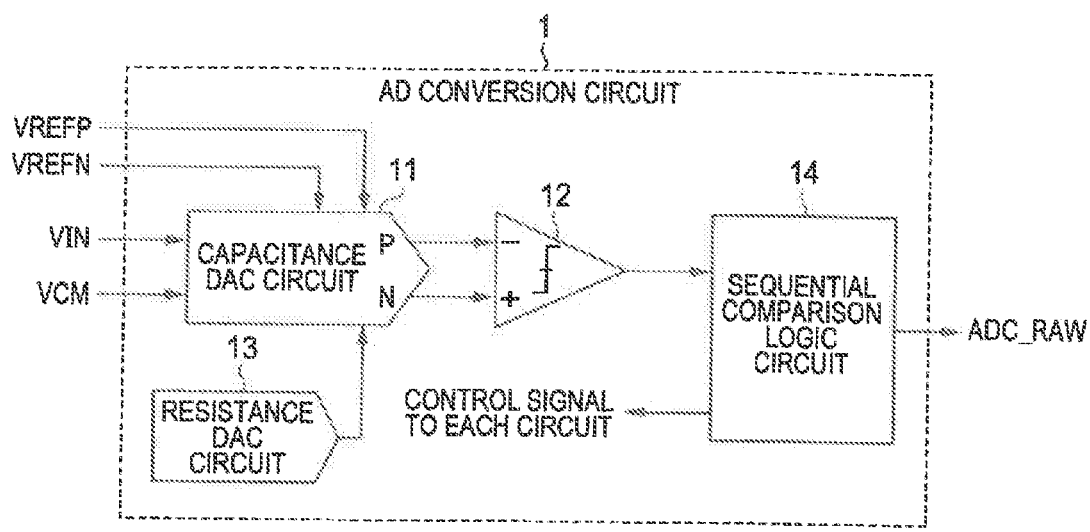
FIG. 6 is a block diagram for showing a configuration example of an AD conversion circuit of a sequential comparison system.

FIG. 6 is a block diagram for showing a configuration example of the ADC 1 of a sequential comparison system.

The ADC 1 shown in the drawing is a 12-bit sequential comparison-type A/D convertor, and is configured using a 6-bit capacitance DAC circuit 11 including one redundant bit, a 7-bit resistance DAC circuit 13, a comparator circuit 12, and a sequential comparison logic circuit 14. The ADC 1 has terminals for the input signal VIN, the standard voltage VCM, the output signal ADC_RAW[12:0], and the reference voltages VREFP and VREFN. The outputs of the capacitance DAC circuit 11 on the P side and the N side are coupled to a negative input terminal and a positive input terminal of the comparator circuit 12, respectively. In this case, "[12:0]" represents a 13-bit digital signal. The same applies to "[X:Y]" notation in the specification. However, since the ADC_RAW[12:0] includes one redundant bit, and thus the amount of information is less than 13 gradation bits. The reference voltages VREFP and VREFN are analog voltages corresponding to the maximum value and the minimum value, and generally serve as a power supply potential and a ground potential, respectively, in many cases. Further, the standard voltage VCM has a potential close to (VREFP+VREFN)/2 in many cases. The configuration shown in FIG. 6 is merely an example set for the following description, and the resolution, the resolution ratio of the capacitance DAC circuit 11 to the resistance DAC circuit 12, and the position of the redundant bit can be appropriately changed.

Figure 7:
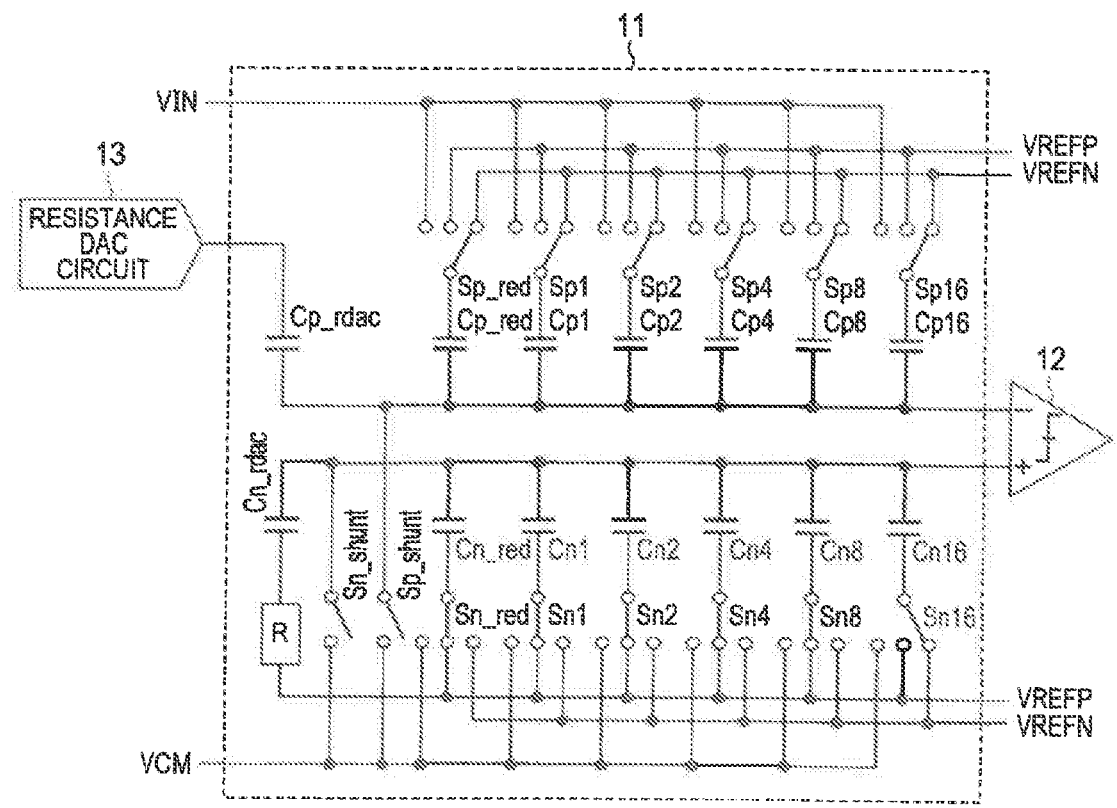
FIG. 7 is a circuit diagram for showing a configuration example of a capacitance DAC circuit of the sequential comparison-type AD conversion circuit.

FIG. 7 is a circuit diagram for showing a configuration example of the capacitance DAC circuit 11 mounted in the sequential comparison-type AD conversion circuit 1. The 7-bit resistance DAC circuit 13 and the comparator circuit 12 to be coupled are also shown in the drawing. The capacitance DAC circuit 11 has 6 bits including one redundant bit, and has, on the p side, six capacitors Cp16, Cp8, Cp4, Cp2, Cp1, and Cp_red and six switches Sp16, Sp8, Sp4, Sp2, Sp1, and Sp_red corresponding to 6 bits. As similar to the above, the capacitance DAC circuit 11 has six capacitors Cn16, Cn8, Cn4, Cn2, Cn1, and Cn_red and six switches Sn16, Sn8, Sn4, Sn2, Sn1, and Sn_red on the n side. The capacitance DAC circuit 11 further has two switches Sp_shunt and Sn_shunt, a capacitor Cp_rdac coupled to the resistance DAC circuit 13 on the p side, and a capacitor Cn_rdac coupled to a resistive element R on then side. The resistance DAC circuit 13 applies a voltage between the VREFP and the VREFN to the capacitor Cp_rdac on the basis of a 7-bit digital value to be set, so that the effective capacitance value is adjusted in a range where the value equal to the capacitor Cp1 is set as the maximum value. Accordingly, the capacitance DAC circuit 11 has seven capacitors having ½ to 1/128 of the capacitance value of the capacitor Cp1, and thus has a function equivalent to a capacitance DAC circuit having six capacitors Cp16, Cp8, Cp4, Cp2, Cp1, and Cp_red.

One terminal of each of the capacitors Cp16, Cp8, Cp4, Cp2, Cp1, Cp_red, and Cp_rdac on the p side is coupled and serves as an output on the p side of the capacitance DAC circuit 11. The other terminals of the capacitors Cp16, Cp8, Cp4, Cp2, Cp1, and Cp_red on the p side are coupled to the six switches Sp16, Sp8, Sp4, Sp2, Sp1, and Sp_red, respectively. Each switch has three inputs. One input is for the input signal VIN, and the other two inputs are for the reference voltages VREFP and VREFN. The other end of the Cp_rdac is coupled to the output of the resistance DAC circuit 13. Further, the output of the capacitance DAC circuit 11 on the P side is coupled to the standard voltage VCM through the switch Sp_shunt.

One terminal of each of the capacitors Cn16, Cn8, Cn4, Cn2, Cn1, Cn_red, and Cn_rdac on the n side is coupled and serves as an output on the N side of the capacitance DAC circuit 11. The other terminals of the capacitors Cn16, Cn8, Cn4, Cn2, Cn1, and Cn_red on the n side are coupled to the six switches Sn16, Sn8, Sn4, Sn2, Sn1, and Sn_red, respectively. Each switch has three inputs. One input is for the standard voltage VCM, and the other two inputs are for the reference voltages VREFP and VREFN. The other end of the Cn_rdac is coupled to the VREFP through the resistor R. Further, the output of the capacitance DAC circuit 11 on the N side is coupled to the standard voltage VCM through the switch Sn_shunt.

The design value of each capacitor configuring the capacitance DAC circuit 11 will be described. When a unit capacitor is represented as Cunit, each of the Cp16 and the Cn16 has a capacitance value obtained by coupling 16 unit capacitors Cunit in parallel as the design value, which corresponds to the most significant bit ADC_RAW[12] of the conversion output of the ADC 1. As similar to the above, each of the Cp8 and the Cn8 has a capacitance value obtained by coupling 8 unit capacitors Cunit in parallel as the design value, which corresponds to ADC_RAW[11]. Each of the Cp4 and the Cn4 has a capacitance value obtained by coupling 4 unit capacitors Cunit in parallel as the design value, which corresponds to ADC_RAW[10]. Each of the Cp2 and the Cn2 has a capacitance value obtained by coupling 2 unit capacitors Cunit in parallel as the design value, which corresponds to ADC_RAW[9]. Further, each of the Cp1 and the Cn1 has a capacitance value same as the unit capacitor Cunit as the design value, which corresponds to ADC_RAW[8]. The design value of each of the Cp_red, the Cn_red, the Cp_rdac, and the Cn_rdac is the same as the capacitance value of the unit capacitor Cunit. Since the design value of each of the Cp_red and the Cn_red is the same as the capacitance value of the unit capacitor Cunit, the corresponding ADC_RAW[7] has the same weight as the ADC_RAW[8], and functions as a redundant bit. Namely, it is possible to correct an error less than the weight same as the ADC_RAW[8] generated at each bit not less than the ADC_RAW[8]. The Cp_red and the Cn_red are referred to as redundant capacitors, and may be arbitrarily arranged at any bit positions.

FIG. 6 will be described again.

The outputs of the capacitance DAC circuit 11 on the P side and the N side are coupled to the N side and the P side of the comparator circuit 12, respectively. The resistance DAC circuit 13 is, for example, a D/A convertor circuit configured using resistive elements and switches, and can be configured using an R-2R circuit, a resistance ladder circuit, and the like. When the input voltage on the P side is higher than that on the N side, the comparator circuit 12 outputs a high level "H". When the input voltage on the P side is lower than that on the N side, the comparator circuit 12 outputs a low level "L". The sequential comparison logic circuit 14 is a circuit that supplies a control signal to each circuit in the ADC 1 to perform a sequential comparison operation. The control signals include a comparison start signal, a sampling start signal, and the like, and control the capacitance DAC circuit 11, the resistance DAC circuit 13, and the comparator circuit 12 in response to an output from the comparator circuit 12.

FIG. 3 in which the ADC 1 is the 12-bit sequential comparison-type A/D convertor will be described again. The error correction logic (ECL) 2 is a circuit that converts the 13-bit signal ADC_RAW[12:0] including the redundant bit into a 12-bit signal ADC_ECL[11:0] including no redundant bit.

Each of the constitutional elements of the calibration circuit 3 will be described using an example of a circuit that corrects the capacitance mismatch of the capacitor Cp16 corresponding to the most significant bit ADC_RAW[12]. In this case, the capacitance mismatch means relative manufacturing variation between the Cp16 and the low-order Cp8+Cp4+Cp2+Cp1+Cp_rdac. It is effective in the calibration of the linearity of the ADC 1 to minimize a relative error rather than to correct an absolute error from the above-described design value of the Cp16. Accordingly, the calibration circuit 3 calculates a difference between the Cp16 and the Cp8+Cp4+Cp2+Cp1+Cp_rdac as a correction value. A configuration example of each constitutional element of the calibration circuit 3 to realize such calibration will be described below in detail.

Figure 8:
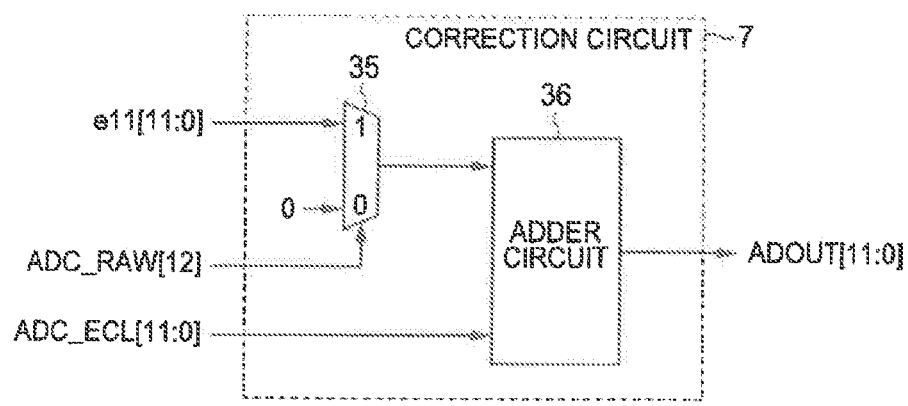
FIG. 8 is a block diagram for showing a configuration example of a correction circuit.

FIG. 8 is a block diagram for showing a configuration example of the correction circuit 7. The correction circuit 7 is configured using a multiplexer 35 and an adder circuit 36. After a correction value e11[11:0] is determined, ADOUT[11:0]=ADC_ECL[11:0]+e11[11:0]*ADC_RAW[12] is satisfied. In this case, the ADOUT[11:0] is an output of the correction circuit 7, and the corrected output e11[11:0] of the A/D convertor is the correction value of the most significant bit in accordance with the amount of capacitance mismatch of the capacitor Cp16. It should be noted that an input line for the ADC_RAW[12] output from the ADC 1 to the correction circuit 7 is not illustrated in FIG. 3.

Figure 9:
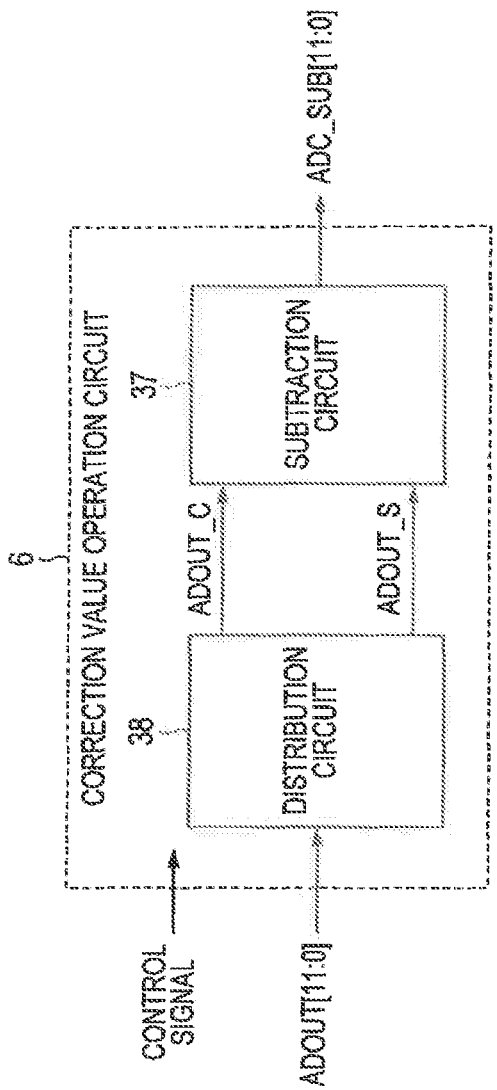
FIG. 9 is a block diagram for showing a configuration example of a correction value operation circuit.

FIG. 9 is a block diagram for showing a configuration example of the correction value operation circuit 6. The correction value operation circuit 6 is configured using a distribution circuit 38 that divides the value of the ADOUT[11:0] into a conversion result ADOUT_C in a sampling state 1 and a conversion result ADOUT_S in a sampling state 2 to hold the results, and a subtraction circuit 37 that obtains a difference ADC_SUB[11:0] between the both results. The sampling state 1 and the sampling state 2 will be described later.

Figure 10:
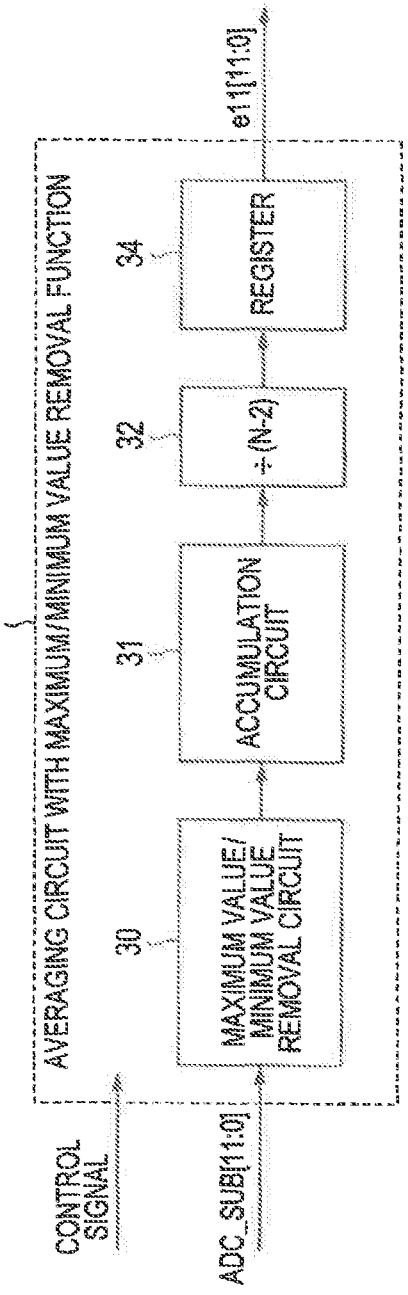
FIG. 10 is a block diagram for showing a configuration example of an averaging circuit having a maximum value/minimum value removal function.

FIG. 10 is a block diagram for showing a configuration example of an averaging circuit 5 having a maximum value/minimum value removal function. The averaging circuit 5 is configured using a maximum value/minimum value removal circuit 30, an accumulation circuit 31, a division circuit 32, and a register 34. The difference ADC_SUB[11:0] from the correction value operation circuit 6 is repeatedly input a plurality of times (N times). In this case, N is a given integer. When a large value is given to N, much time is required for the calibration. However, an effect of random noise can be reduced. The maximum value/minimum value removal circuit 30 removes one maximum value and one minimum value from N differences ADC_SUB[11:0], and the remaining N−2 differences are output to the accumulation circuit 31. The accumulation circuit 31 accumulates the input N−2 differences ADC_SUB[11:0] to obtain a total value, and outputs the same to the division circuit 32. The division circuit 32 divides the input total value by N−2 to calculate the average value of the correction values with the maximum value and the minimum value removed, and the average value is held by the register 34. The register 34 holds the final correction value e11[11:0].

Figure 11:
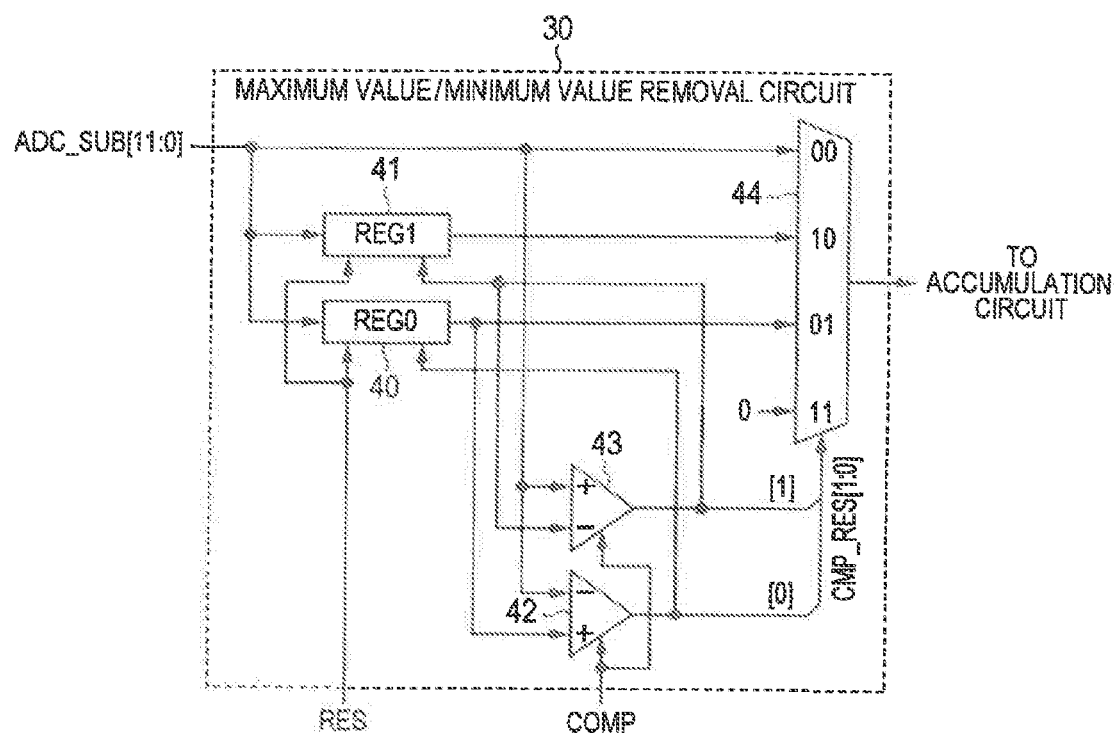
FIG. 11 is a block diagram for showing a configuration example of a maximum value/minimum value removal circuit.

FIG. 11 is a block diagram for showing a configuration example of the maximum value/minimum value removal circuit 30. The ADC_SUB[11:0] and control signals RES and COMP are input into the maximum value/minimum value removal circuit 30, and the maximum value/minimum value removal circuit 30 is configured using two registers (REG0 and REG1) 40 and 41, two comparators 42 and 43, and a multiplexer 44 having four inputs and one output. The two comparators 42 and 43 compare the values stored in the two registers (REG0 and REG1) 40 and 41 with the input ADC_SUB[11:0] to output comparison results CMP_RES [1:0]. A comparison result CMP_RES[1] shows that the input ADC_SUB[11:0] is larger than the value stored in the register (REG1) 41, and a comparison result CMP_RES[0] shows that the input ADC_SUB[11:0] is smaller than the value stored in the register (REG0) 40. When the comparison result CMP_RES[1] is asserted, the register (REG1) 41 reads and stores the ADC_SUB[11:0]. When the comparison result CMP_RES[0] is asserted, the register (REG0) 40 reads and stores the ADC_SUB[11:0]. In the multiplexer 44, input are the ADC_SUB[11:0], the value stored in the register (REG1) 41, the value stored in the register (REG0) 40, and 0, which are selected in accordance with the comparison result CMP_RES[1:0] to be output to the accumulation circuit 31.

During the calibration operation, the maximum value of the differences ADC_SUB[11:0] input from the beginning of the accumulation to the time is stored in the register (REG1) 41, and the minimum value is similarly stored in the register (REG0) 40. If the ADC_SUB[11:0] input at the time is larger than the value stored in the register (REG1) 41, the CMP_RES[1:0] is 10, and the value stored in the register (REG1) 41, namely, the maximum value up to the time is output to the accumulation circuit 31. In addition, a new ADC_SUB[11:0] at the time, namely, a new maximum value is stored in the register (REG1) 41. If the ADC_SUB[11:0] input at the time is smaller than the value stored in the register (REG0) 40, the CMP_RES[1:0] is 01, and the value stored in the register (REG0) 40, namely, the minimum value up to the time is output to the accumulation circuit 31. In addition, a new ADC_SUB[11:0] at the time, namely, a new minimum value is stored in the register (REG0) 40. In the case where the ADC_SUB[11:0] input at the time is between the value stored in the register (REG0) 40 and the value stored in the register (REG1) 41, the ADC_SUB[11:0] is output to the accumulation circuit 31 as it is, and the values of the registers (REG0 and REG1) 40 and 41 are not updated.

One maximum value and one minimum value among the input N differences ADC_SUB[11:0] are removed by such an operation, and the remaining N−2 differences are output to the accumulation circuit 31.

It should be noted that since initial values are stored in the registers (REG0 and REG1) 40 and 41 when the accumulation is started, the following control is further needed. The CMP_RES [1:0] is forcibly set to 11 by the control signal COMP in two rounds immediately after the beginning of the accumulation. The first ADC_SUB[11:0] immediately after the beginning of the accumulation is forcibly stored in each of the registers (REG0 and REG1) 40 and 41 by the control signal RES.

Figure 12:
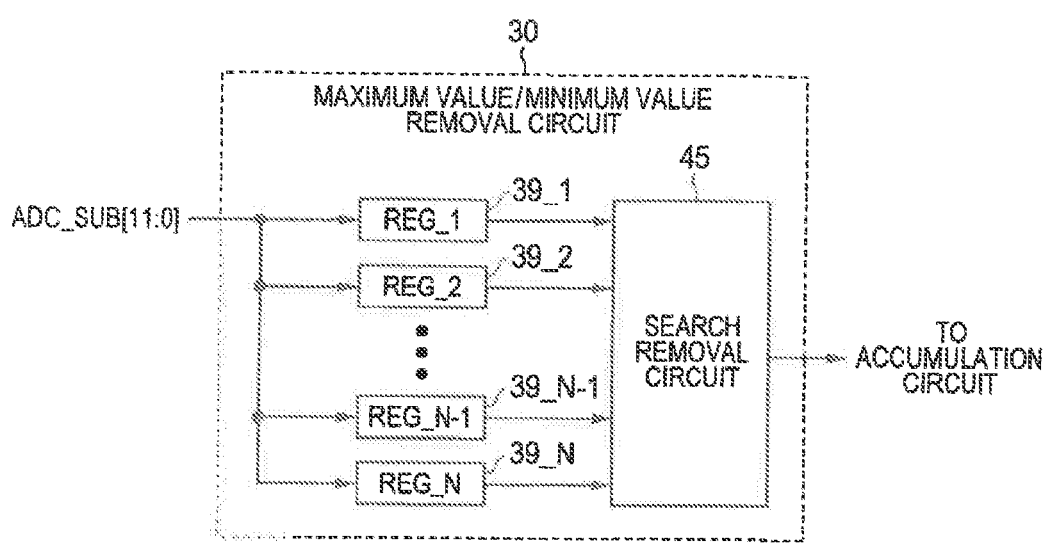
FIG. 12 is a block diagram for showing another configuration example of the maximum value/minimum value removal circuit.

FIG. 12 is a block diagram for showing another configuration example of the maximum value/minimum value removal circuit 30. The maximum value/minimum value removal circuit 30 is configured using N registers (REG_1 to REG_N) 39_1 to 39_N storing N input signals ADC_SUB [11:0], and a search removal circuit 45 that searches the values stored in the registers for the maximum value and the minimum value and sequentially outputs the values stored in the registers other than the maximum value and the minimum value to the accumulation circuit 31.

The maximum value/minimum value removal circuit 30 is operated in temporally-separated phases such as a phase 1 and a phase 2 after completion of the phase 1. In the phase 1, the sequentially-input values ADC_SUB[11:0] are sequentially stored in the N registers (REG_1 to REG_N) 39_1 to 39_N. In the phase 2, the maximum value and the minimum value are searched for among the values stored in the N registers (REG_1 to REG_N) 39_1 to 39_N, and the values stored in the registers other than the maximum value and the minimum value are sequentially output to the accumulation circuit 31.

In addition to the configuration examples exemplified in FIG. 11 and FIG. 12, the maximum value/minimum value removal circuit 30 can employ various configurations without departing from the scope thereof.

In the case where the capacitance mismatch occurs among the capacitors configuring the capacitance DAC circuit 11 in the ADC 1, the linearity of the A/D conversion result is deteriorated.

Figure 13:
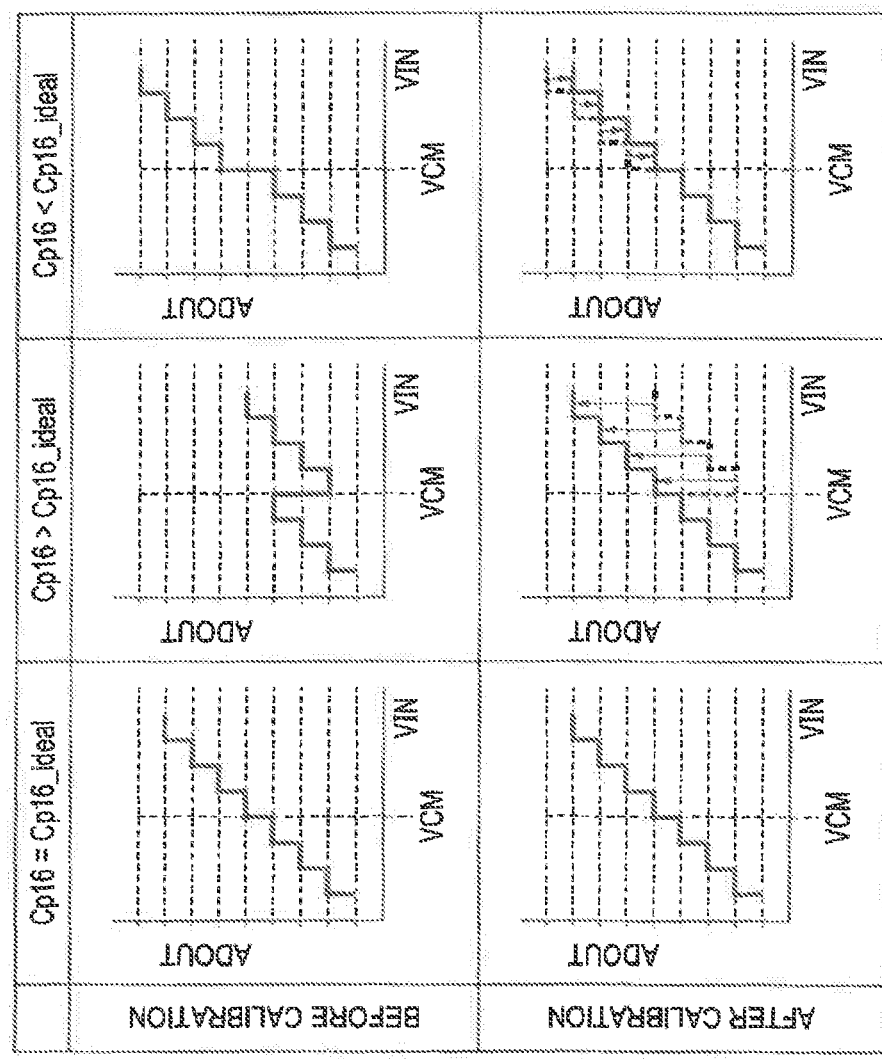
FIG. 13 is an explanatory diagram for showing an operation example of calibration.

FIG. 13 is an explanatory diagram for showing an operation example of the calibration. The capacitance mismatch of the capacitor Cp16 corresponding to the most significant bit is corrected by the calibration operation shown in the first embodiment. FIG. 13 shows graphs of A/D conversion characteristics before and after the calibration in which the horizontal axis represents an input analog voltage VIN and the vertical axis represents a digital conversion result ADOUT. A relation around where the input voltage VIN is equal to the standard voltage VCM (VIN=VCM) is enlarged in each graph. The graphs show the A/D conversion characteristics of three cases in which the Cp16 is in an ideal state (Cp16=Cp16_ideal), the capacitance value of the Cp16 is biased to the large side due to mismatch (Cp16>Cp16_ideal), and the capacitance value of the Cp16 is biased to the small side (Cp16<Cp16_ideal). In this case, "the Cp16 is in an ideal state" does not mean that the capacitance value of the Cp16 is equal to the design value (absolute accuracy), but means that the capacitance value of the Cp16 is ideal from the viewpoint of consistency (relative accuracy) of the capacitance values of the other capacitors. For example, it is ideal that the capacitance value of the Cp16 is exactly twice the capacitance value of the Cp8, exactly four times the capacitance value of the Cp4, exactly eight times the capacitance value of the Cp2, and exactly sixteen times each capacitance value of the Cp1, Cp_red, and Cp_rdac. Accordingly, "Cp16_ideal" merely means the ideal state in a symbolic manner, and a concrete number is not defined.

The most significant bit of the A/D conversion result is switched around VIN=VCM. Namely, when the VIN is lower than the VCM, the most significant bit ADC_RAW [12] is 0. When the VIN is higher than the VCM, the most significant bit ADC_RAW[12] is 1. When the VIN is lower than the VCM, the Cp16 does not contribute to the conversion. When the VIN is higher than the VCM, the Cp16 contributes to the conversion. Thus, if the mismatch of the capacitance value of the Cp16 occurs, the conversion result is deviated from the ideal linear characteristics, and shows stepped characteristics. Namely, when the capacitance value of the Cp16 is biased to the large side (Cp16>Cp16_ideal), the conversion result is biased to the small side. When the capacitance value of the Cp16 is biased to the small side (Cp16<Cp16_ideal), the conversion result is biased to the large side. In the first embodiment, the steps are eliminated around VIN=VCM where the ADCOUT[11] is switched from 0 to 1 by adding the correction value e11[11:0] to the ADC_ECL[11:0] when the ADC_RAW[12]=1. In the lower part of FIG. 13, the dashed lines represent the characteristics (ADC_ECL[11:0]) before the correction, the arrows represent the correction value e11[11:0], the solid lines represent the characteristics ADOUT[11:0] after the correction.

The calibration operation will be described in more detail.

Figure 15:
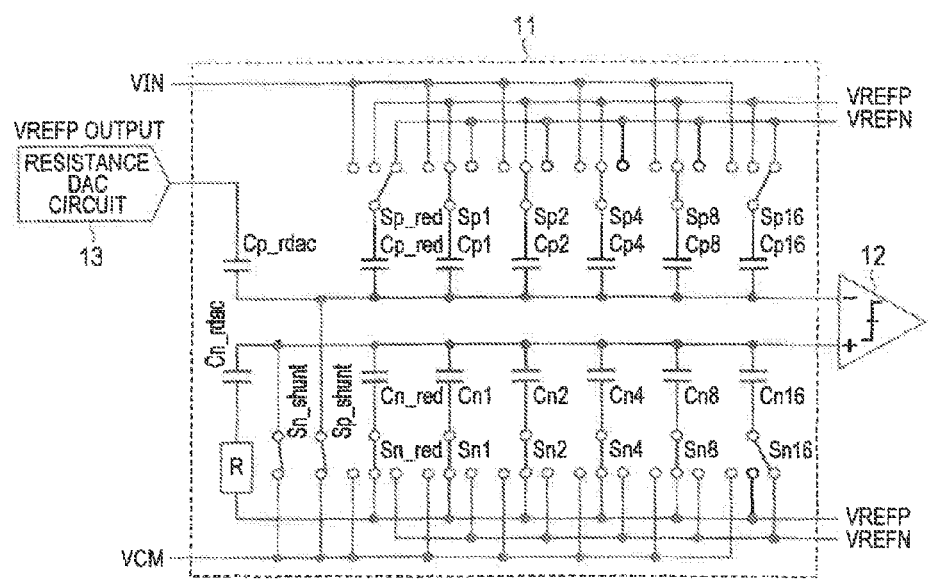
FIG. 15 is a circuit diagram for showing the states of the switches in the sampling state of capacitors lower than the most significant bit in the capacitance DAC circuit in the calibration operation.
Figure 16:
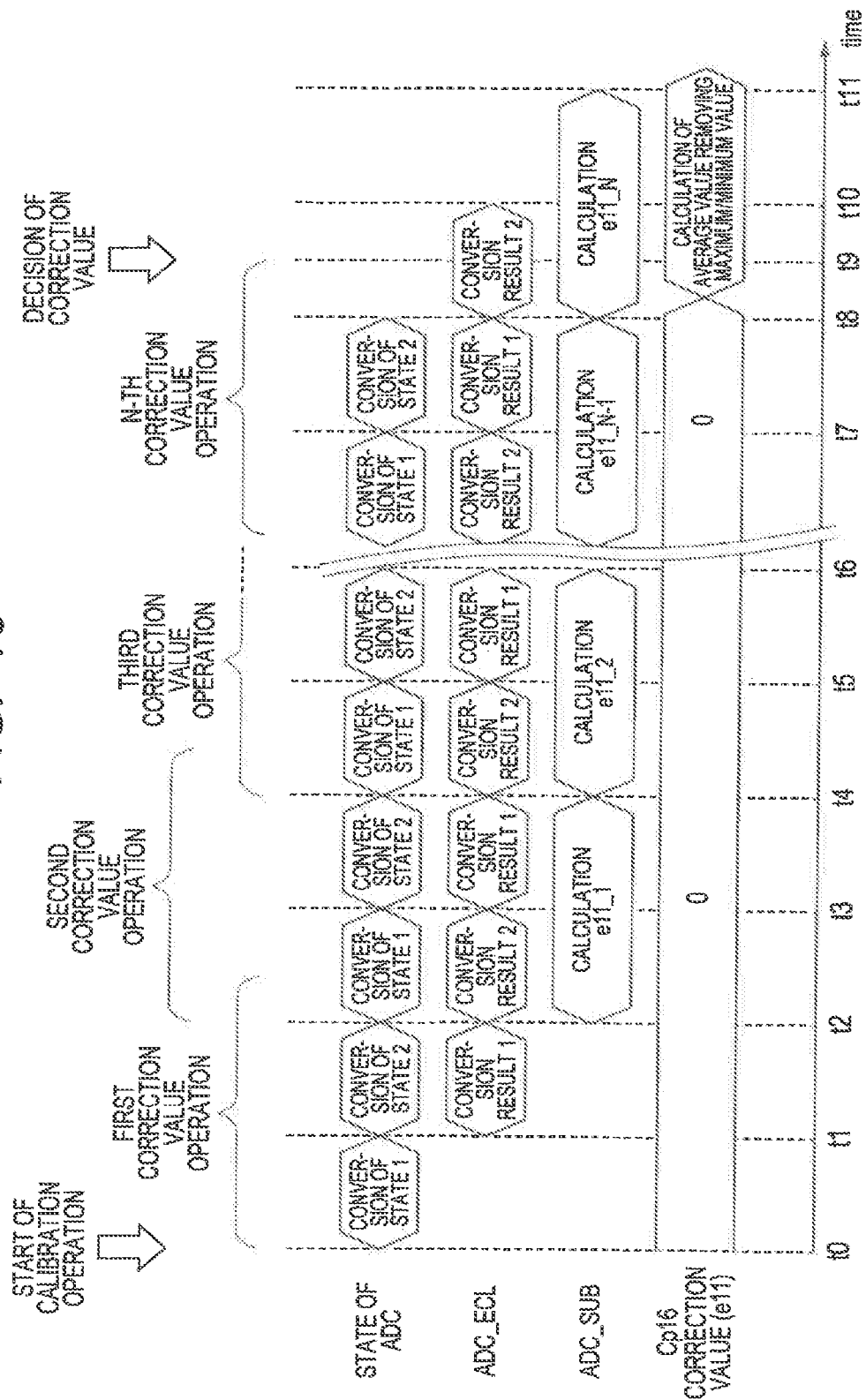
FIG. 16 is a timing chart for showing an operation example in which the correction value of the capacitor corresponding to the most significant bit in the capacitance DAC circuit is calculated in the calibration operation.

FIG. 16 is a timing chart for showing an operation example in which the correction value of the capacitor of the most significant bit in the capacitance DAC circuit 11 is calculated in the calibration operation. The circuit diagrams of FIG. 14 and FIG. 15 show an internal switch coupling state of the capacitance DAC circuit 11 and an output state from the resistance DAC circuit 13 in a sampling operation period at the time of the calibration operation when the correction value e11[11:0] is obtained for the capacitance mismatch of the capacitor Cp16 corresponding to the most significant bit.

Figure 14:
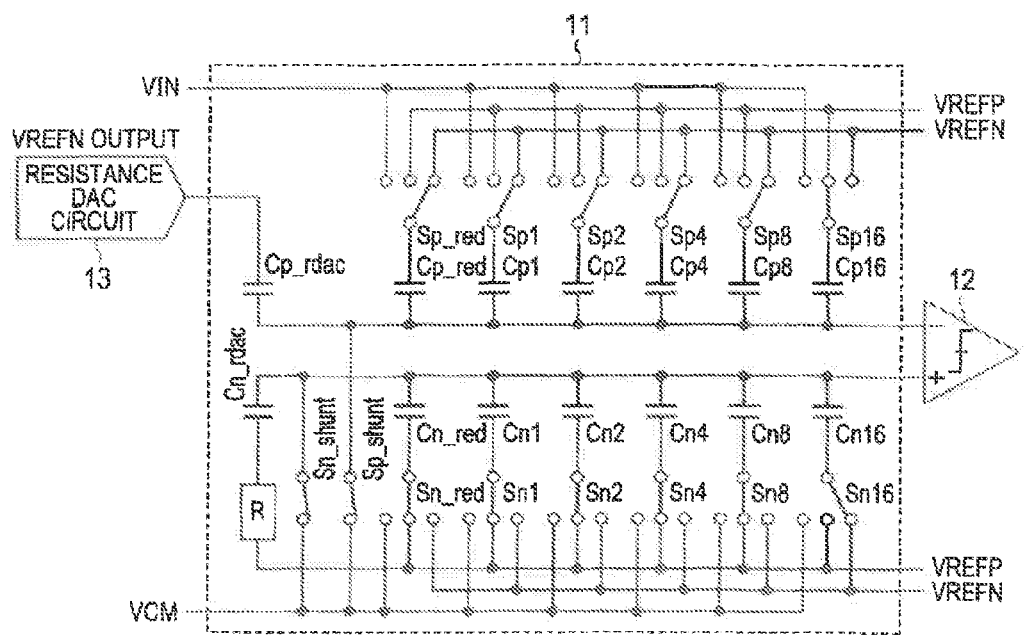
FIG. 14 is a circuit diagram for showing the states of switches in a sampling state of the most significant bit in the capacitance DAC circuit in a calibration operation.

FIG. 14 shows the states of the switches and an output state from the resistance DAC circuit 13 in the sampling state (state 1) of the capacitor Cp16 corresponding to the most significant bit in the capacitance DAC circuit 11. The outputs of the capacitance DAC circuit 11 on the P side and the N side are coupled to the standard voltage VCM through the switches Sp_shunt and Sn_shunt, respectively. The capacitor Cp16 is coupled to the VREFP through the switch Sp16, and the capacitors Cp8, Cp4, Cp2, Cp1, and Cp_red are coupled to the VREFN through the switches Sp8, Sp4, Sp2, Sp1, and Sp_red, respectively. The resistance DAC circuit 13 outputs the VREFN, which is accordingly equivalent to the state in which the capacitor Cp_rdac is coupled to the VREFN.

FIG. 15 shows the states of the switches and an output state from the resistance DAC circuit 13 in the sampling state (state 2) of the capacitors (Cp8+Cp4+Cp2+Cp1+Cp_rdac) lower than the most significant bit in the capacitance DAC circuit 11. As similar to the above-described state 1, the outputs of the capacitance DAC circuit 11 on the P side and the N side are coupled to the standard voltage VCM through the switches Sp_shunt and Sn_shunt, respectively. The capacitor Cp16 is coupled to the VREFN through the switch Sp16, and the capacitors Cp8, Cp4, Cp2, and Cp1 are coupled to the VREFP through the switches Sp8, Sp4, Sp2, and Sp1, respectively. The capacitor Cp_red is coupled to the VREFN through the switch Sp_red as similar to the state 1. On the other hand, the resistance DAC circuit 13 outputs the VREFP, which is accordingly equivalent to the state in which the capacitor Cp_rdac is coupled to the VREFP.

FIG. 16 will be described again.

When the calibration operation is started at Time t0, the ADC 1 performs the conversion operation after the sampling in the state 1 is performed, and outputs a conversion result 1 at Time t1. The conversion operation is performed at Time t1 after the sampling in the state 2 is performed, and a conversion result 2 is output at Time t2. Thereafter, the first correction value e11_1 is calculated between Time t2 and Time t4. This is the first correction value operation. In the ideal state where noise is not present at all, a difference (the conversion result 1–the conversion result 2) obtained by subtracting the conversion result 2 from the conversion result 1 corresponds to the correction value e11[11:0]. The calculation method of the correction value uses conversion of a difference between electric charges sampled at the Cp16 in the state 1 and electric charges sampled at the Cp8+Cp4+Cp2+Cp1+Cp_rdac in the state 2 into the amount of mismatch of the Cp16. The conversion result 1 (ACDOUT_C) and the conversion result 2 (ADOUT_S) are input into the subtraction circuit 37 by the distribution circuit 38 so that a difference obtained by subtracting the conversion result 2 from the conversion result 1 corresponds to the ADC_SUB [11:0] in the correction value operation circuit 6 (FIG. 9), and a subtraction is performed while adjusting the timing to output the value obtained by subtracting the conversion result 2 from the conversion result 1 as the ADC_SUB[11:0]. The timing is control by the control signal output from the control circuit 4 (FIG. 3).

As similar to the above, a correction value e11_2 is calculated by performing the sampling in the state 1 from Time t2, the AD conversion, the sampling in the state 2, the AD conversion, and the first correction value operation (the conversion result 1–the conversion result 2). This operation is repeated N times in total in a pipeline manner, so that N correction values e11_1 to e11_N are obtained until Time t9. The result is input to the averaging circuit 5 to remove the maximum value and the minimum value, and the average value of the remaining N−2 correction values is calculated to obtain the correction value e11 of the Cp16.

In the ideal state where noise is not present at all, the value of the ADC_SUB[11:0] corresponds to the correction value e11[11:0]. However, an error is actually included in the value of the ADC_SUB[11:0] due to the effect of noise (elemental noise, power supply noise, noise sneaked from other circuits, or the like). If a set of the sampling in the state 1, the AD conversion, the sampling in the state 2, the AD conversion, and the correction value operation (the conversion result 1–the conversion result 2) is repeated N times, N values ADC_SUB[11:0], namely, N correction values e11_1 to e11_N are obtained. The averaging circuit 5 performs an operation in which N−2 values ADC_SUB[11:0] obtained by removing the maximum value and the minimum value from the N correction values e11_1 to e11_N (ADC_SUB [11:0]) are accumulated, and then the accumulated value is divided by N−2 so that the average value is calculated to output the correction value e11[11:0].

The calibration operation for the capacitor Cp16 corresponding to the most significant bit has been described above. However, capacitors corresponding to a plurality of bits higher than the redundant bit can be targeted for the calibration operation.

A calibration operation in which high-order 3 bits are corrected will be described. The correction value e11[11:0] of the Cp16, the correction value e10[11:0] of the Cp8, and the correction value e9 [11:0] of the Cp4 are sequentially calculated. It is determined on the basis of the ADC_RAW [12:10] whether or not each of the capacitors Cp16, Cp8, and Cp4 has contributed to the AD conversion. If contributed, the corresponding correction value among the correction values e11[11:0], e10[11:0], and e9[11:0] is added to the conversion result ADC_ECL[11:0] to obtain a conversion output ADOUT[11:0].

Figure 18:
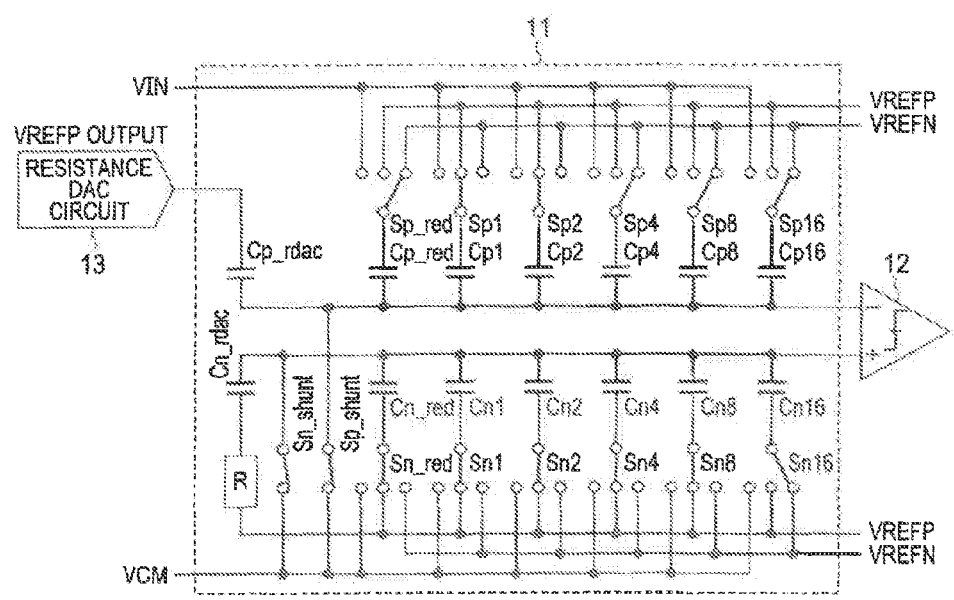
FIG. 18 is a circuit diagram for showing the states of the switches in the sampling state of the capacitors lower than the third bit from the most significant bit in the capacitance DAC circuit in the calibration operation.
Figure 19:
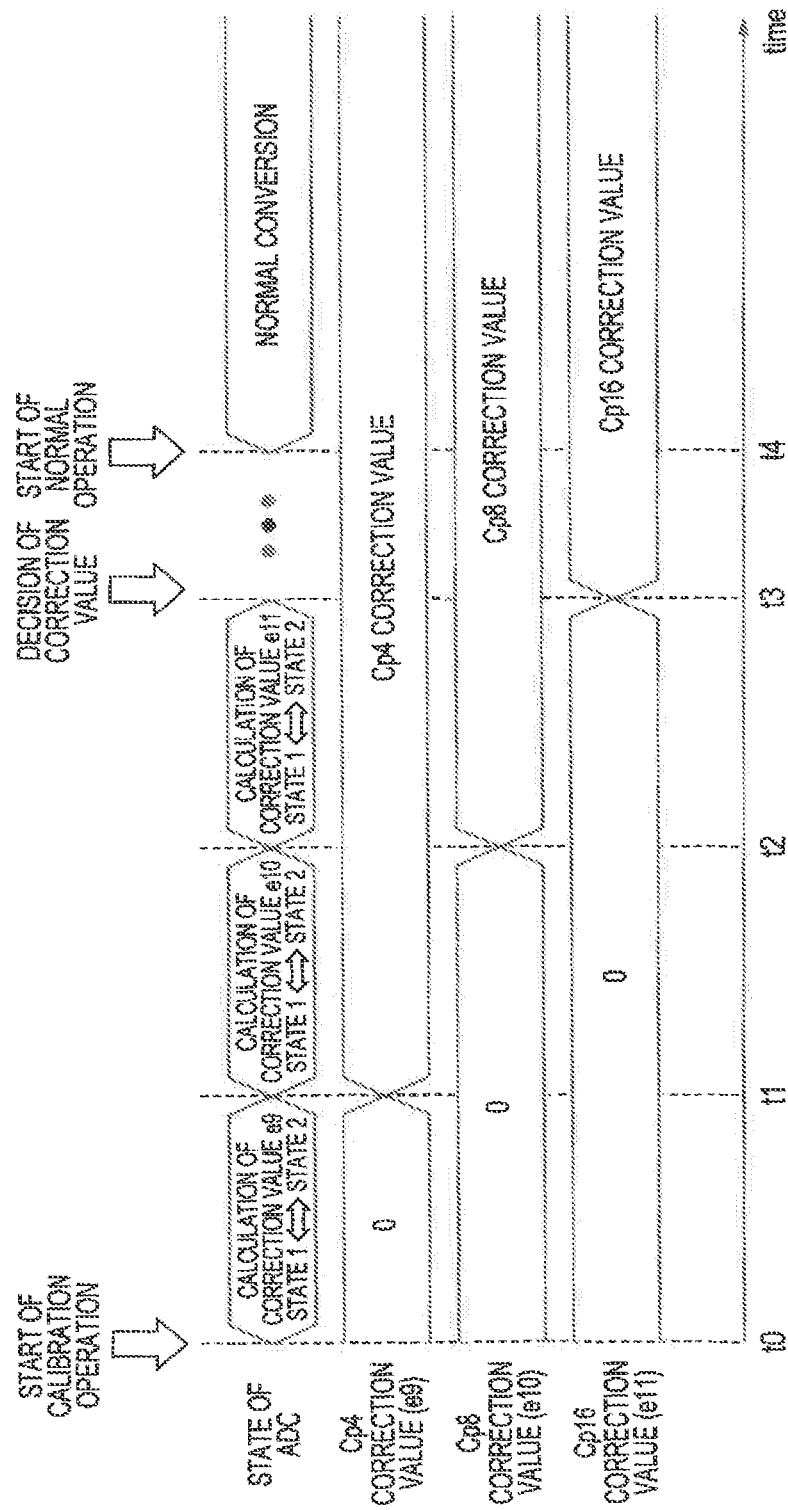
FIG. 19 is a timing chart for showing an operation example in which the correction values of the capacitors from the most significant bit to the third bit in the capacitance DAC circuit are calculated in the calibration operation.

FIG. 19 is a timing chart for showing an operation example in which the correction values e11[11:0], e10[11:0], and e9[11:0] of the capacitors Cp16, Cp8, and Cp4 from the most significant bit to the third bit in the capacitance DAC circuit 11 are calculated in the calibration operation. The circuit diagrams of FIG. 17 and FIG. 18 show an internal switch coupling state of the capacitance DAC circuit 11 and an output state from the resistance DAC circuit 13 in the sampling operation period of the calibration operation when the correction value e9[11:0] is obtained for the capacitance mismatch of the capacitor Cp4 corresponding to the third bit from the most significant bit.

Figure 17:
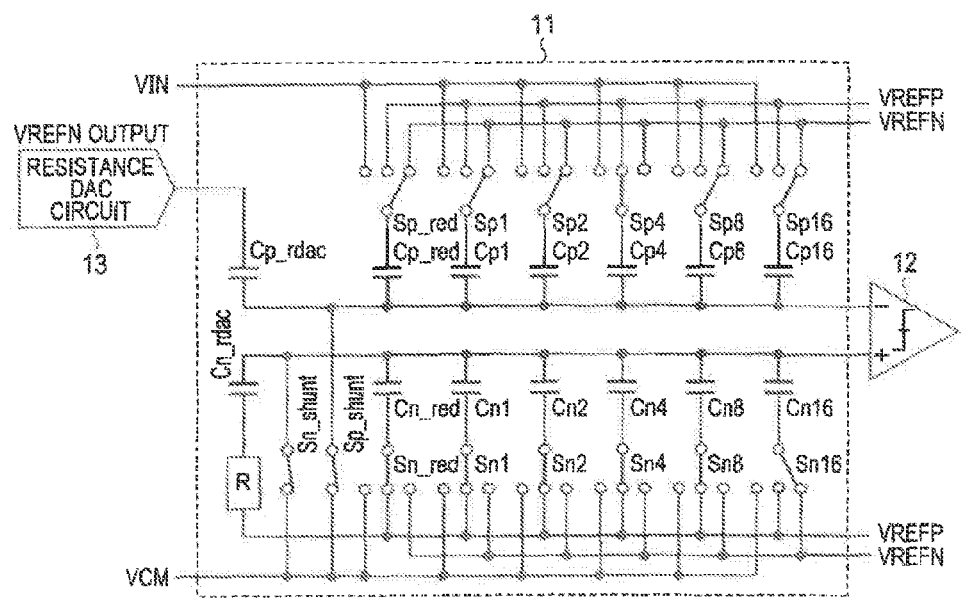
FIG. 17 is a circuit diagram for showing the states of the switches in the sampling state of the capacitor corresponding to the third bit from the most significant bit in the capacitance DAC circuit in the calibration operation.

FIG. 17 shows the states of the switches and an output state from the resistance DAC circuit 13 in the sampling state (state 1) of the capacitor Cp4 corresponding to the third bit from the most significant bit in the capacitance DAC circuit 11. The outputs of the capacitance DAC circuit 11 on the P side and the N side are coupled to the standard voltage VCM through the switches Sp_shunt and Sn_shunt, respectively. The capacitor Cp4 is coupled to the VREFP through the switch Sp4, and the capacitors Cp16, Cp8, Cp2, Cp1, and Cp_red are coupled to the VREFN through the switches Sp16, Sp8, Sp2, Sp1, and Sp_red, respectively. The resistance DAC circuit 13 outputs the VREFN, which is accordingly equivalent to the state in which the capacitor Cp_rdac is coupled to the VREFN.

FIG. 18 shows the states of the switches and an output state from the resistance DAC circuit 13 in the sampling state (state 2) of the capacitors (Cp2+Cp1+Cp_rdac) lower than the third bit from the most significant bit in the capacitance DAC circuit 11. As similar to the above-described state 1, the outputs of the capacitance DAC circuit 11 on the P side and the N side are coupled to the standard voltage VCM through the switches Sp_shunt and Sn_shunt, respectively. The capacitors Cp16, Cp8, and Cp4 are coupled to the VREFN through the switches Sp16, Sp8, and Sp4, respectively, and the capacitors Cp2 and Cp1 are coupled to the VREFP through the switches Sp2 and Sp1, respectively. The capacitor Cp_red is coupled to the VREFN through the switch Sp_red as similar to the state 1. On the other hand, the resistance DAC circuit 13 outputs the VREFP, which is accordingly equivalent to the state in which the capacitor Cp_rdac is coupled to the VREFP.

Although not shown in the drawing, the operation of calculating the correction value by performing the sampling in the state 1, the AD conversion, the sampling in the state 2, the AD conversion, and the correction value operation (the conversion result 1−the conversion result 2) according to the sequence similar to FIG. 16 is repeated N times in total in a pipeline manner, so that N correction values e9_1 to e9_N are obtained. The result is input to the averaging circuit 5, and the average value of the N−2 correction values obtained by removing the maximum value and the minimum value is calculated to obtain the correction value e9 of the Cp4.

Figure 20:
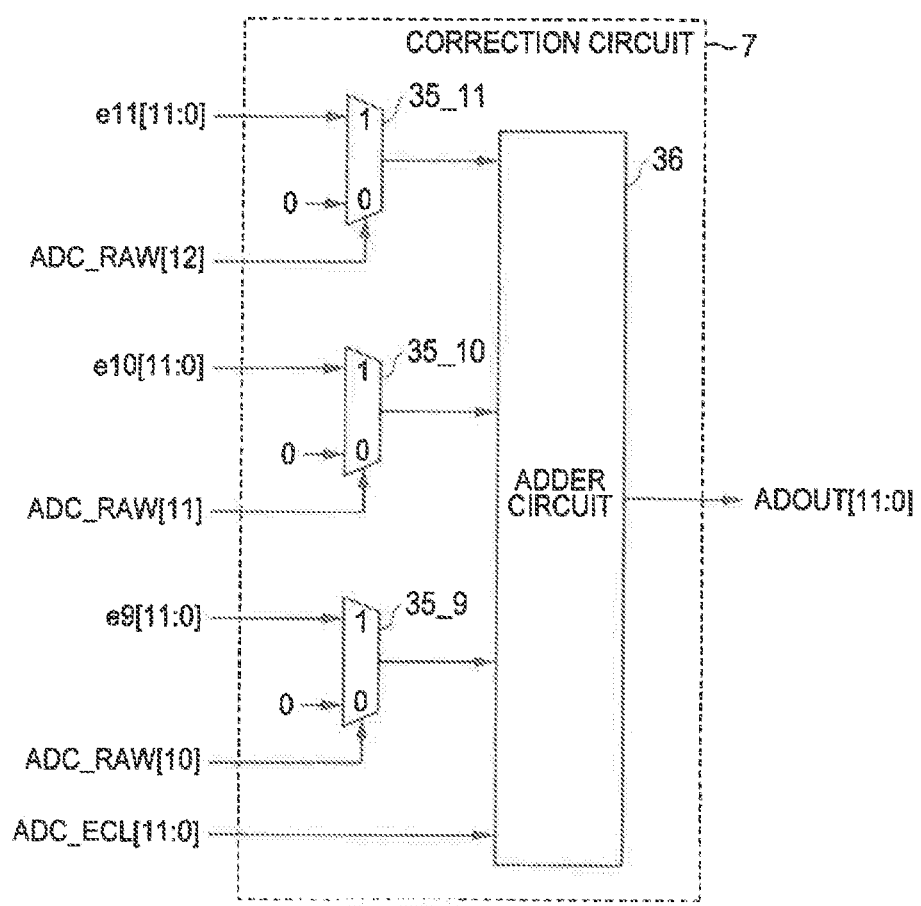
FIG. 20 is a block diagram for showing a configuration example of the correction circuit adapted for the calibration in which the correction values of the capacitors from the most significant bit to the third bit in the capacitance DAC circuit are calculated.
Figure 21:
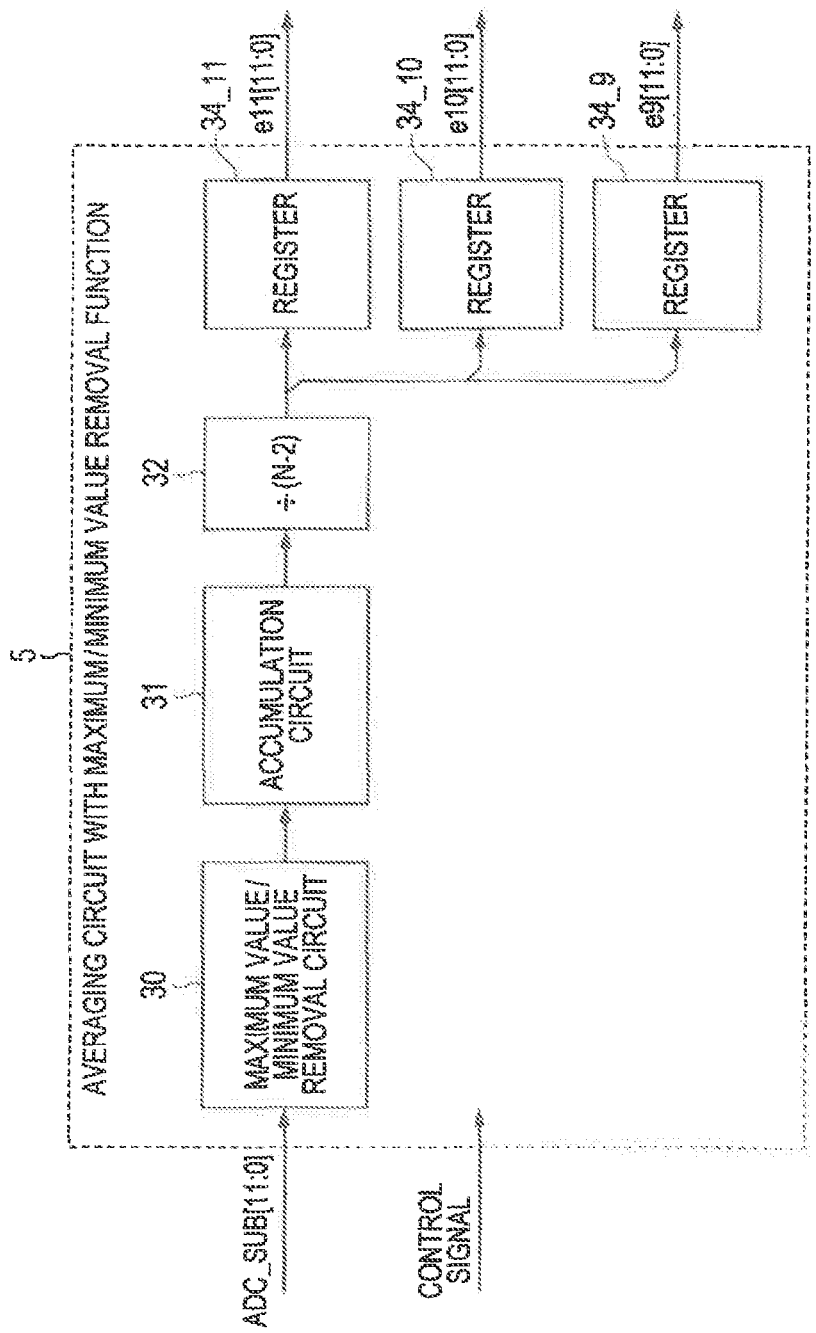
FIG. 21 is a block diagram for showing a configuration example of the averaging circuit having a maximum value/minimum value removal function adapted for the calibration in which the correction values of the capacitors from the most significant bit to the third bit in the capacitance DAC circuit are calculated.

In order to calculate three correction values corresponding to three capacitors from the most significant bit to the third bit to be used for correction, the calibration circuit 3 includes a correction circuit 7 shown in FIG. 20 instead of the correction circuit shown in FIG. 8, and includes an averaging circuit 5 shown in FIG. 21 instead of the averaging circuit shown in FIG. 10.

FIG. 21 is a block diagram for showing a configuration example of an averaging circuit 5 having a maximum value/minimum value removal function adapted for the calibration in which the correction values of the capacitors from the most significant bit to the third bit in the capacitance DAC circuit are calculated. As similar to FIG. 10, the ADC_SUB[11:0] is input. The averaging circuit 5 is configured using a maximum value/minimum value removal circuit 30, an accumulation circuit 31, a division circuit 32, and three registers 34_11, 34_10, and 34_9. In the above-described sequence, the maximum value and the minimum value are removed from the N correction values e9_1 to e9_N input from the ADC_SUB[11:0] by the maximum value/minimum value removal circuit 30, and the total of the remaining N−2 correction values is calculated by the accumulation circuit 31. The total is divided by N−2 by the division circuit 32 to calculate the correction value e9 of the Cp4 as the average value, and the correction value e9 is stored in the register 34_9.

The sampling operation and the calculation operation of the correction value in the calibration operation when the correction value e10[11:0] is obtained for the capacitance mismatch of the capacitor Cp8 corresponding to the second bit from the most significant bit are the same as the above, and the calculated correction value e10[11:0] is stored in the register 34_10 of the averaging circuit 5. Further, the sampling operation and the calculation operation of the correction value in the calibration operation when the correction value e11[11:0] is obtained for the capacitance mismatch of the capacitor Cp16 corresponding to the most significant bit are the same as the operations described with reference to FIG. 14 to FIG. 16, and the calculated correction value e11[11:0] is stored in the register 34_11 of the averaging circuit 5. The accumulation circuit 31 is reset every time the correction values e9[11:0], e10[11:0], and e11[11:0] are calculated.

FIG. 20 is a block diagram for showing a configuration example of the correction circuit 7 adapted for the calibration in which the correction values e11[11:0], e10[11:0], and e9[11:0] of the capacitors Cp16, Cp8, and Cp4 from the most significant bit to the third bit in the capacitance DAC circuit 11 are calculated. The correction circuit 7 is configured using three multiplexers 35_11, 35_10, and 35_10 corresponding to three correction values and an adder circuit 36. When the ADC_RAW[12]=1, it is determined that the capacitor Cp16 has contributed to the A/D conversion, and the corresponding correction value e11[11:0] is added to the ADC_ECL[11:0]. As similar to the above, when the ADC_RAW[11]=1, it is determined that the capacitor Cp8 has contributed to the A/D conversion. When the ADC_RAW[10]=1, it is determined that the capacitor Cp4 has contributed to the A/D conversion. Then, the corresponding correction values e10[11:0] and e9[11:0] are added to the ADC_ECL[11:0]. Namely, the equation of ADOUT[11:0] =ADC_ECL[11:0]+e11[11:0]*ADC_RAW[12]+e10[11:0]*ADC_RAW[11]+e9[11:0]*ADC_RAW[10] is satisfied.

In the above description, the number of correction values before the averaging that are obtained when calculating the correction values e11[11:0], e10[11:0], and e9[11:0] is N in all the cases. However, different numbers can be set depending on the correction value. On the other hand, if the same number is set, it is only necessary for the averaging circuit 5 to repeat the same operation, and thus the configuration and the control can be simplified.

FIG. 19 will be described again.

When the calibration operation is started at Time t0, the correction value e9[11:0] of the Cp4 is calculated first. A set of the sampling in the state 1, the AD conversion, the sampling in the state 2, the AD conversion, and the correction value operation (the conversion result 1−the conversion result 2) is repeated, and the remaining values obtained by removing the maximum value and the minimum value are averaged, so that the correction value e9[11:0] of the Cp4 can be obtained at Time t1. Next, the correction value e10[11:0] of the Cp8 is calculated from Time t1. As similar to the above, a set of the sampling in the state 1, the AD conversion, the sampling in the state 2, the AD conversion, and the correction value operation (the conversion result 1−the conversion result 2) is repeated, and the remaining values obtained by removing the maximum value and the minimum value are averaged, so that the correction value e10[11:0] of the Cp8 can be obtained at Time t2. Finally, the correction value e11[11:0] of the Cp16 is calculated from Time t2. As similar to the above, a set of the sampling in the state 1, the AD conversion, the sampling in the state 2, the AD conversion, and the correction value operation (the conversion result 1−the conversion result 2) is repeated, and the remaining values obtained by removing the maximum value and the minimum value are averaged, so that the correction value e11[11:0] of the Cp16 can be obtained at Time t3. From Time t4, the normal operation can be performed by operating the correction circuit 7 described with reference to FIG. 20.

Accordingly, the calibration for not only the most significant bit, but also the capacitors corresponding to the bits lower than the most significant bit can be performed. According to the operation principle, the bits higher than the redundant bit can be corrected.

Figure 2:
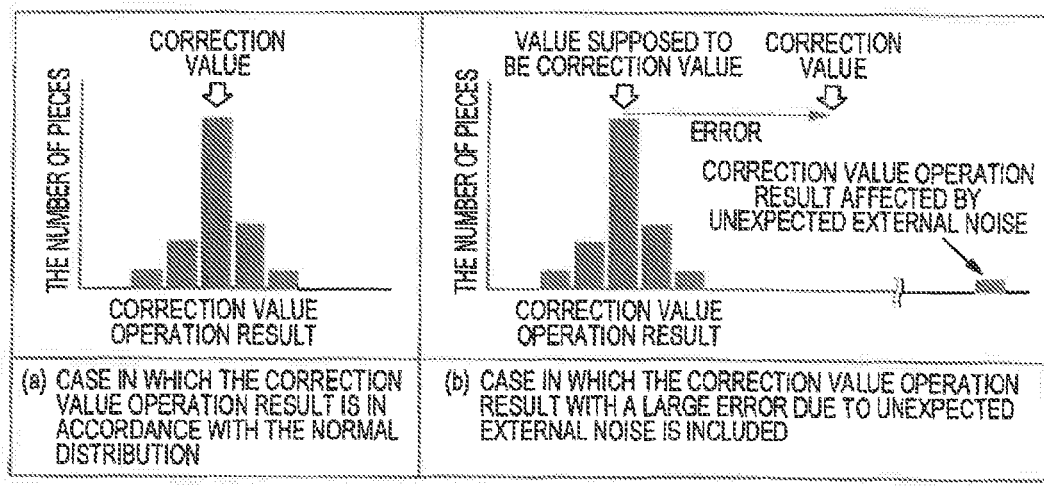
FIG. 2 are explanatory diagrams each schematically showing an impact on a correction value of the calibration when unexpected large external noise is generated.

As described above, the first embodiment is characterized in that the maximum value/minimum value removal circuit 30 is provided in the averaging circuit 5 in the calibration circuit 3. Even in the case where one of the correction value operation results includes a value largely deviated from the value that is supposed to be the correction value due to unexpected external noise such as noise of the power supply, the ground, or the reference voltage, or noise sneaked from the inside or outside of the semiconductor device during the correction value operation period of the calibration as shown in FIG. 2B, the deviated value can be removed from the averaging targets by providing the maximum value/minimum value removal circuit 30. Accordingly, a value close to the value that is supposed to be the correction value is likely to be selected, and the accuracy of the calibration is improved.

On the other hand, even in the case of an averaging circuit having no such characteristics, the effect of the unexpected external noise can be removed in principle by largely increasing the number of times of averaging. However, a period of time that can be set as a starting period of time in a system is generally limited in actual use. Namely, a period of time that can be assigned to the calibration is limited. In order to eliminate the deviation of the correction value due to the effect of the unexpected external noise that is difficult to predict in the design stage by increasing the number of times of averaging, the number of times of averaging is needlessly increased. The consideration for the effect due to the unexpected noise can be eliminated when setting the number of times of averaging by providing the characteristics, and the optimum number of times of averaging can be set. Namely, it is only necessary to set the number of times of averaging that can remove the effect of random noise such as elemental noise.

It should be noted that the bit positions where the redundant capacitors Cp_red and Cp_rdac are mounted can be arbitrarily set as described above. However, the calibration can be performed for the capacitors higher than the bit positions where the redundant capacitors Cp_red and Cp_rdac are mounted. Further, the calibration operation is performed from the low-order bit to the most significant bit in order as described in the embodiment. An error in a low-order bit is corrected by the calibration for the bit, and the calibration for high-order bits can be more accurately performed. It should be noted that the number of bits for which the calibration is actually executed can be arbitrarily set.

[Second Embodiment] Registers Holding the Maximum Value and the Minimum Value

A second embodiment shows another configuration example for adding a function of removing the maximum value and the minimum value to an averaging circuit 5 in a calibration circuit 3.

Figure 22:
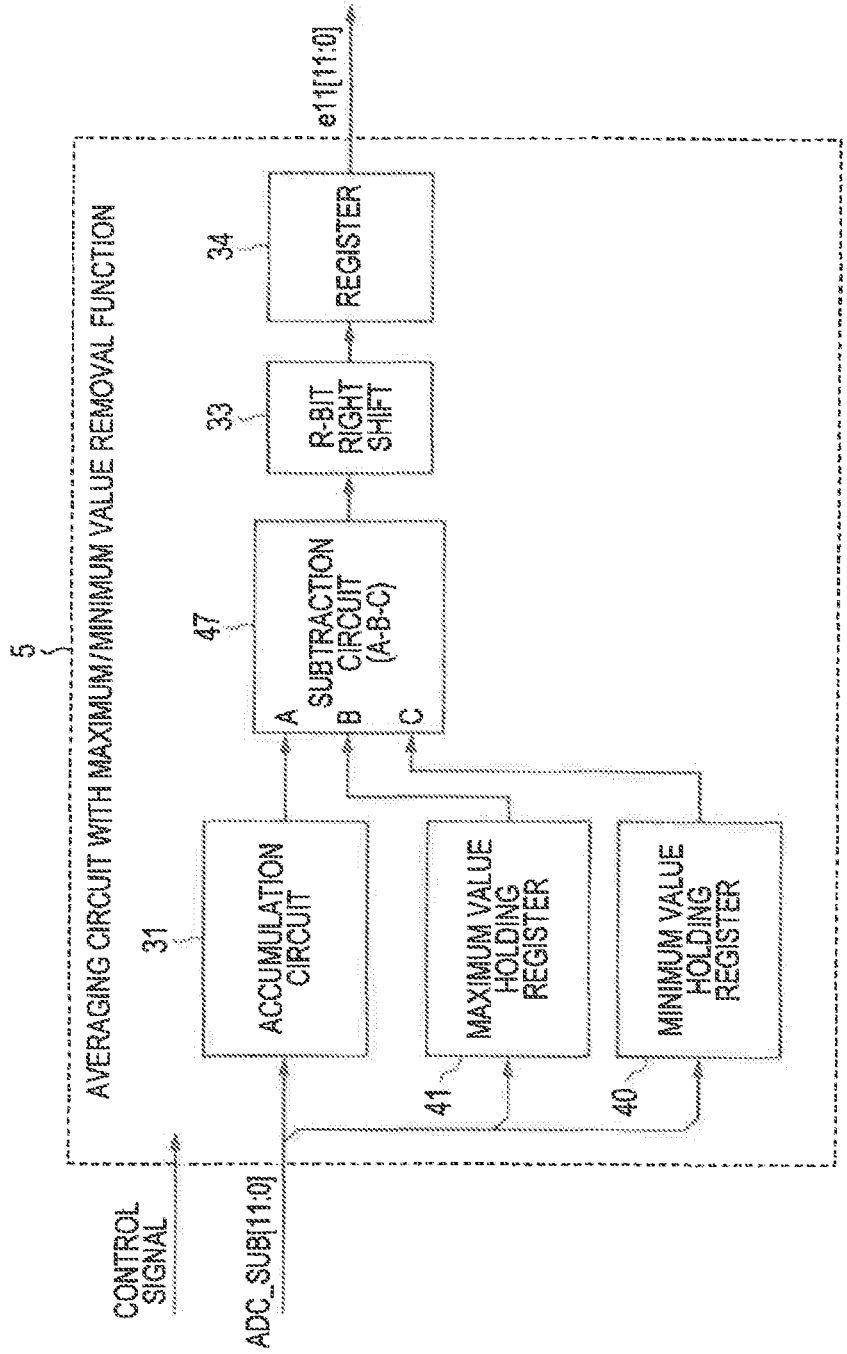
FIG. 22 is a block diagram for showing a configuration example of an averaging circuit having a maximum value/minimum value removal function according to a second embodiment.

FIG. 22 is a block diagram for showing a configuration example of an averaging circuit 5 having a maximum value/minimum value removal function according to the second embodiment. As similar to the averaging circuit 5 shown in FIG. 10, the averaging circuit 5 includes the accumulation circuit 31 and the register 34. On the other hand, the averaging circuit 5 includes a register 41 holding the maximum value, a register 40 holding the minimum value, and a subtraction circuit 47 instead of providing the maximum value/minimum value removal circuit 30, and includes an R-bit right shift circuit 33 (R is an integer determined depending on N) instead of the division circuit 32.

After the reset is cancelled, the accumulation circuit 31 calculates the total value of N correction values e11_1 to e11_N input to the ADC_SUB[11:0]. The register 41 sequentially compares the N correction values e11_1 to e11_N in parallel to finally hold the maximum value. The register 40 also sequentially compares the N correction values e11_1 to e11_N in parallel to finally hold the minimum value. The subtraction circuit 47 subtracts the maximum value input from the register 41 to a terminal B and the minimum value input from the register 40 to a terminal C from the total value of the N correction values e11_1 to e11_N input to a terminal A, and outputs the result. In this case, if the number N of correction values before the averaging is set to "the R-th power of 2+2", the division circuit 32 using N−2 can be replaced by the R-bit right shift circuit 33. The R-bit right shift circuit 33 does not need active circuits such as transistors as long as R is a fixed value, and can be mounted only by changing wirings. The calculated average value is held by the register 34 as the correction value e11[11:0].

The other configurations and operations are the same as those in the first embodiment, and thus the explanations thereof will be omitted. In this case, the second embodiment can be changed to an embodiment in which a calibration operation is performed for capacitors corresponding to a plurality of bits. In the averaging circuit 5 shown in FIG. 22, the register 34 is changed to a plurality of registers (for example, the registers 34_11, 34_10, and 34_9) storing a plurality of correction values as similar to FIG. 21, and the accumulation circuit 31, the maximum value register 41, and the minimum value holding register 40 are configured and controlled to be reset every time the correction values are calculated and stored in the registers.

Accordingly, it is not necessary to mount the maximum value/minimum value removal circuit 30 as described with reference to FIG. 11 and FIG. 12, and the circuit scale can be reduced. In addition, the control can be simplified.

Further, the circuit scale necessary for a division can be largely reduced by replacing the division circuit 32 with the R-bit right shift circuit 33. It should be noted that if the number N of correction values before the averaging is set to "the R-th power of 2+2", the division circuit 32 using N−2 can be replaced by the R-bit right shift circuit 33 in the first embodiment.

[Third Embodiment] Registers Holding X Large Values and X Small Values

In the first and second embodiments, one maximum value and one minimum value are removed from N correction values before averaging, and the remaining N−2 correction values are averaged to obtain the final correction value. Accordingly, values deviated from the value supposed to be the correction value due to the effect of unexpected noise are removed to calculate a more accurate correction value. On the contrary, X large correction values including the maximum value and X small correction values including the minimum value are removed from N correction values before averaging, and the remaining N−2X correction values are averaged to obtain the final correction value in the embodiment. In this case, the number of large correction values and the number of small correction values to be removed may be different from each other.

Such expansion of functions can be realized by improving the averaging circuit 5 shown in FIG. 22.

Figure 23:
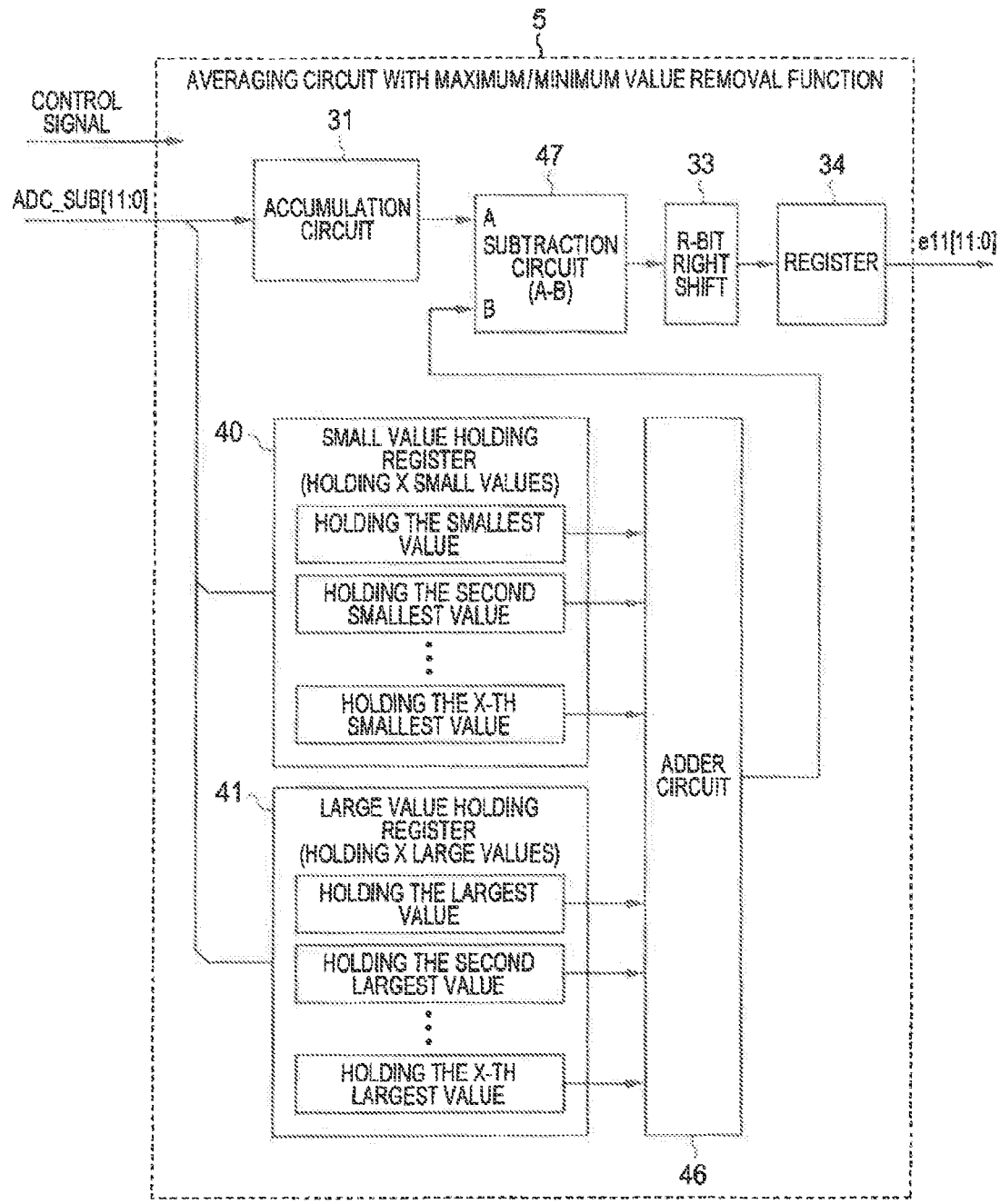
FIG. 23 is a block diagram for showing a configuration example of an averaging circuit having a maximum value/minimum value removal function according to a third embodiment.

FIG. 23 is a block diagram for showing a configuration example of an averaging circuit 5 having a maximum value/minimum value removal function according to the third embodiment. As similar to the averaging circuit 5 shown in FIG. 22, the averaging circuit 5 includes the accumulation circuit 31, the subtraction circuit 47, the R-bit right shift circuit 33, and the register 34. On the other hand, the register 41 holding the maximum value and the register 40 holding the minimum value are expanded to a large value holding register 41 holding X large values and a small value holding register 40 holding X small values, respectively, and an adder circuit 46 is further provided.

After the reset is cancelled, the accumulation circuit 31 calculates the total value of N correction values e11_1 to e11_N input to the ADC_SUB[11:0]. The register 41 sequentially compares the N correction values e11_1 to e11_N in parallel to hold X large correction values including the maximum value. The register 40 also sequentially compares the N correction values e11_1 to e11_N in parallel to hold X small correction values including the minimum value. The adder circuit 46 adds the X large correction values held by the register 41 to the X small correction values held by the register 40, and supplies the total to the subtraction circuit 47. The subtraction circuit 47 subtracts the total value of the X large correction values and the X small correction values input to a terminal B from the total value of the N correction values e11_1 to e11_N input to a terminal A, and outputs the result. In this case, if the number N of correction values before the averaging is set to "the R-th power of 2+2X", the R-bit right shift circuit 33 can be used. The calculated average value is held by the register 34 as the correction value e11[11:0].

The other configurations and operations are the same as those in the first and second embodiments, and thus the explanations thereof will be omitted. In this case, the third embodiment can be changed to an embodiment in which a calibration operation is performed for capacitors corresponding to a plurality of bits. In the averaging circuit 5 shown in FIG. 23, the register 34 is changed to a plurality of registers (for example, the registers 34_11, 34_10, and 34_9) storing a plurality of correction values as similar to FIG. 21, and the accumulation circuit 31, the large value holding register 41, and the small value holding register 40 are configured and controlled to be reset every time the correction values are calculated and stored in the registers.

As described above, even if the correction value operation results include a plurality of largely-deviated results due to unexpected external noise generated a plurality of times, the largely-deviated results can be removed by expanding the large value holding register 41 and the small value holding register 40. The configuration is more effective from the viewpoint of removing the effect of the unexpected external noise. Therefore, it is possible to withstand calibration in a noisy circumstance as compared to the first and second embodiments. Further, there may be a circumstance in which large unexpected noise is periodically, regularly, and relatively-frequently generated so that the correction value operation results are deviated by a specific amount. In this case, it is impossible to remove the effect of the noise in principle by simply increasing the number of times of averaging. However, the effect can be removed by providing the characteristics of the embodiment.

[Fourth Embodiment] Limiter

Figure 24:
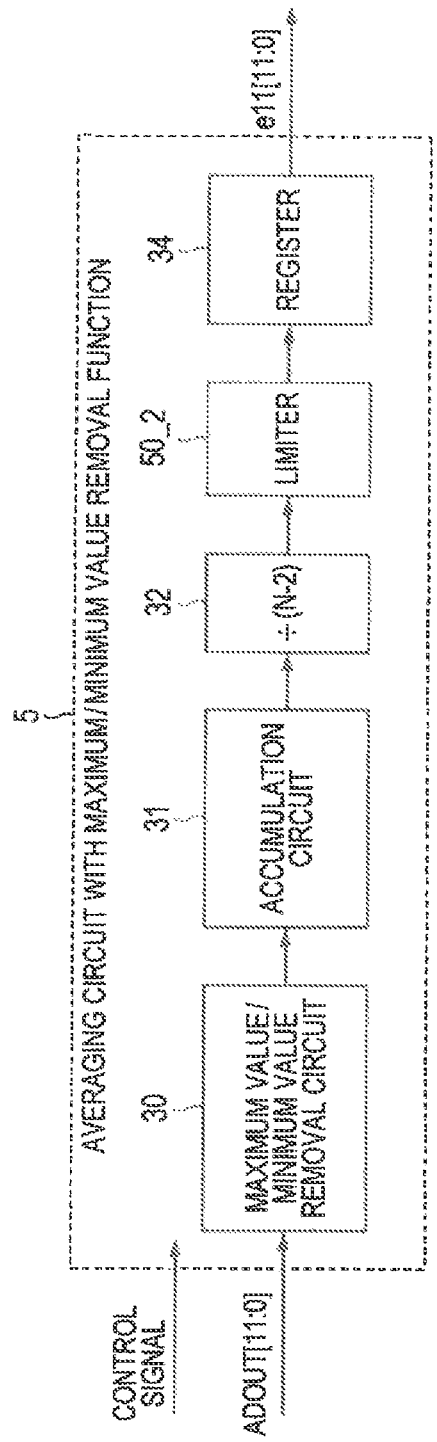
FIG. 24 is a block diagram for showing a first configuration example of an averaging circuit having a maximum value/minimum value removal function according to a fourth embodiment.
Figure 25:
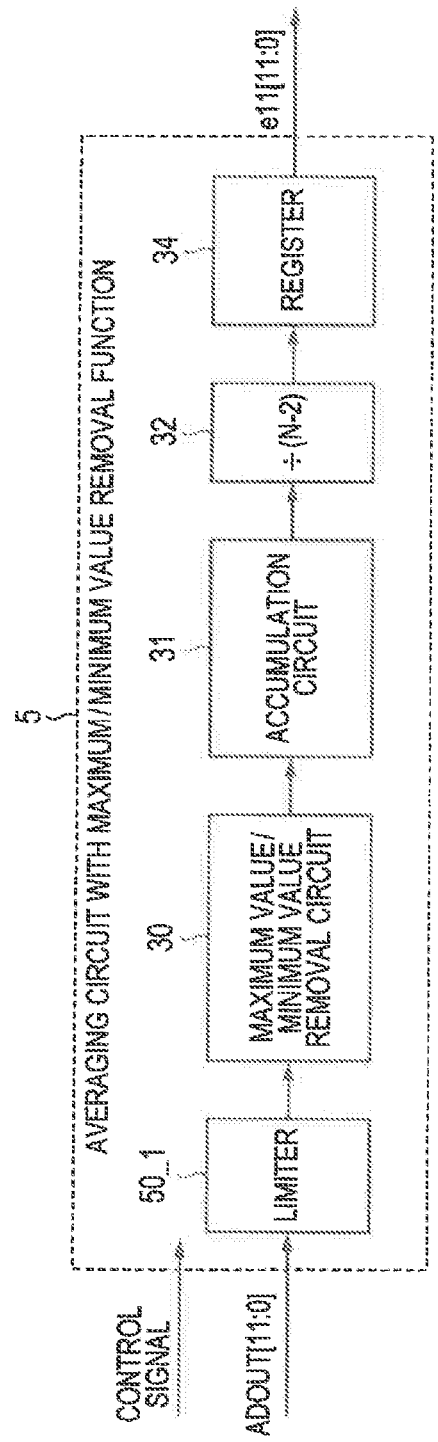
FIG. 25 is a block diagram for showing a second configuration example of the averaging circuit having a maximum value/minimum value removal function according to the fourth embodiment.
Figure 26:
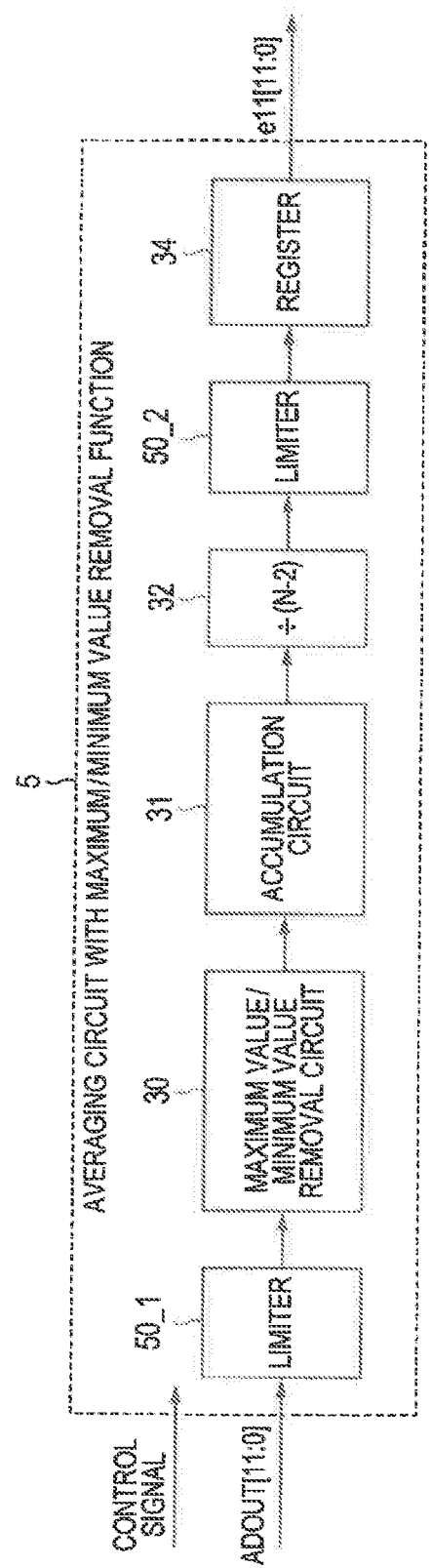
FIG. 26 is a block diagram for showing a third configuration example of the averaging circuit having a maximum value/minimum value removal function according to the fourth embodiment.

In the case where external noise more than expected is further generated, the deviation of the correction value can be reduced by adding a limiter to the averaging circuit 5 of each of the first to third embodiments. FIGS. 24 to 26 are block diagrams for showing various configuration examples of an averaging circuit 5 to which a limiter of a fourth embodiment is added. In this case, the limiter is a circuit that limits an output when an input value is deviated from a setting range. For example, when an input value is larger than a predetermined upper limit, the value is replaced by the upper limit. When an input value is smaller than a predetermined lower limit, the value is replaced by the lower limit.

FIG. 24 is a block diagram for showing a first configuration example of the averaging circuit 5. As similar to the averaging circuit shown in FIG. 10, the averaging circuit 5 includes the maximum value/minimum value removal circuit 30, the accumulation circuit 31, the division circuit 32, and the register 34, and further includes a limiter 50_2 on the preceding stage of the register 34 holding the value of the correction value e11[11:0]. When an output of the division circuit (÷(N−2) computing unit) 32 is deviated from the setting range of the limiter 50_2, the limiter 50_2 can limit the correction value e11[11:0].

FIG. 25 is a block diagram for showing a second configuration example of the averaging circuit 5. As similar to the averaging circuit shown in FIG. 10, the averaging circuit 5 includes the maximum value/minimum value removal circuit 30, the accumulation circuit 31, the division circuit 32, and the register 34, and further includes a limiter 50_1 on the preceding stage of the maximum value/minimum value removal circuit 30. When a correction value input before averaging is deviated from the setting range of the limiter 50_1, the limiter 50_1 can limit the correction value. Accordingly, a value out of an assumed range is not input to the accumulation circuit 30, and, for example, overflow in the accumulation circuit 30 can be prevented from being generated.

FIG. 26 is a block diagram for showing a third configuration example of the averaging circuit 5. As similar to the averaging circuit shown in FIG. 10, the averaging circuit 5 includes the maximum value/minimum value removal circuit 30, the accumulation circuit 31, the division circuit 32, and the register 34, and further includes the limiter 50_1 on the preceding stage of the maximum value/minimum value removal circuit 30 and the limiter 50_2 on the preceding stage of the register 34. When a correction value input before averaging is deviated from the setting range of the limiter 50_1, the limiter 50_1 can limit the correction value. When an output of the division circuit (÷(N−2) computing unit) 32 is deviated from the setting range of the limiter 50_2, the limiter 50_2 can limit the correction value e11[11:0]. Accordingly, a value out of an assumed range is not input to the accumulation circuit 30, and, for example, overflow in the accumulation circuit 30 can be prevented from being generated. In addition, the correction value e11[11:0] to be calculated can be limited.

By adding the limiter (s) 50_1 and/or 50_2 to the averaging circuit 5 as shown in the fourth embodiment, it is possible to prevent a situation in which the accuracy of A/D conversion is more deteriorated in the case where the calibration is performed in the surrounding circumstance of the calibration noisier more than expected than the case where the calibration is not performed. Even if a value largely deviated from the correction value to be actually obtained is calculated due to external noise at the time of calibration, it is possible to prevent the deterioration of accuracy above a certain level by providing the limiter 50_2 on the preceding stage of the register 34. Even if large noise that cannot be removed in the subsequent stage is present, the effect can be eased to some extent by averaging by proving the limiter 50_1 on the preceding stage of the maximum value/minimum value removal circuit 30, because the input value to the accumulation circuit 31 is limited.

In this case, the setting values (upper limit/lower limit) of the limiters 50_1 and 50_2 are desirably determined in consideration of variation of elements to be corrected so as to prevent the correction value e11[11:0] supposed to be obtained from being deviated from the setting range of each limiter. On the other hand, in the case where errors due to actual manufacturing variation of capacitors are large and a correct correction value is deviated from the setting range of each limiter, the products are selected in a circumstance with less external noise at the time of product delivery, so that the selected products can be removed from the delivery targets.

In the above description of the fourth embodiment, a calibration operation is performed for only the Cp16 corresponding to the most significant bit. However, the fourth embodiment can be changed to an embodiment in which a calibration operation is performed for capacitors corresponding to a plurality of bits. For example, in the averaging circuit 5 shown in FIG. 10, the limiter 50_2 is provided in the subsequent stage of the division circuit 32, and/or the limiter 50_1 is provided in the preceding stage of the maximum value/minimum value removal circuit 30. The limiter 50_2 may be provided in the preceding stage of each of the registers 34_11, 34_10, and 34_9. Further, for example, in the averaging circuit 5 shown in FIG. 22 according to the second embodiment, the register 34 is changed to the registers (for example, the registers 34_11, 34_10, and 34_9) storing the correction values as similar to FIG. 21, and the limiter 50_2 is provided in the subsequent stage of the division circuit 32, and/or the limiter 50_1 is provided in the preceding stage of the maximum value/minimum value removal circuit 30. In this case, the limiter 50_2 may be provided in the preceding stage of each of the registers 34_11, 34_10, and 34_9.

[Fifth Embodiment] Offset Calibration

Each of the first to fourth embodiments shows an application example to calibration for mismatch components of the capacitive elements in the capacitance DAC circuit 11 in the sequential comparison-type A/D convertor. However, the present invention can be applied to calibration for other components. In a fifth embodiment, calibration for offset errors of the ADC 1 that is the sequential comparison-type A/D convertor same as that in each of the first to fourth embodiments will be described.

Figure 27:
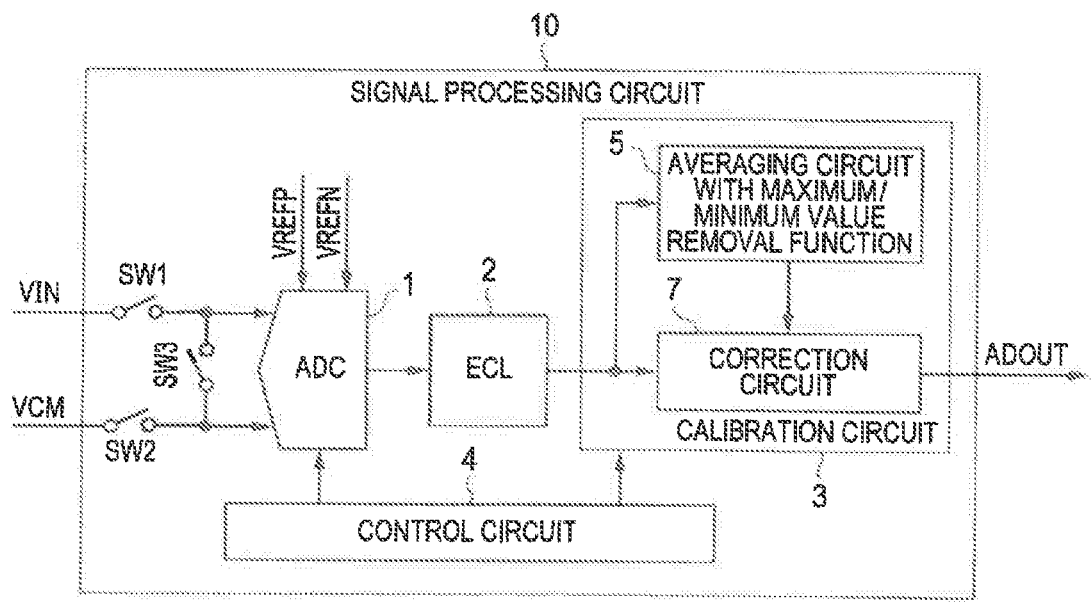
FIG. 27 is a block diagram for showing a configuration example of an AD convertor with an offset calibration circuit that is a signal processing circuit according to a fifth embodiment.

FIG. 27 is a block diagram for showing a configuration example of an AD convertor with an offset calibration circuit that is a signal processing circuit 10 according to the fifth embodiment. As similar to the signal processing circuit shown in FIG. 3, the signal processing circuit 10 includes the ADC 1, the ECL 2, the calibration circuit 3, and the control circuit 4, and further includes a switch SW1 on a route from the input voltage VIN to the ADC 1, a switch SW2 on a route from the standard voltage VCM to the ADC 1, and a switch SW3 between the input terminals of the input voltage VIN and the standard voltage VCM of the ADC 1. The control circuit 4 controls the switch SW1, the switch SW2, and the switch SW3 in addition to the ADC 1, the ECL 2, and the calibration circuit 3.

Figure 28:
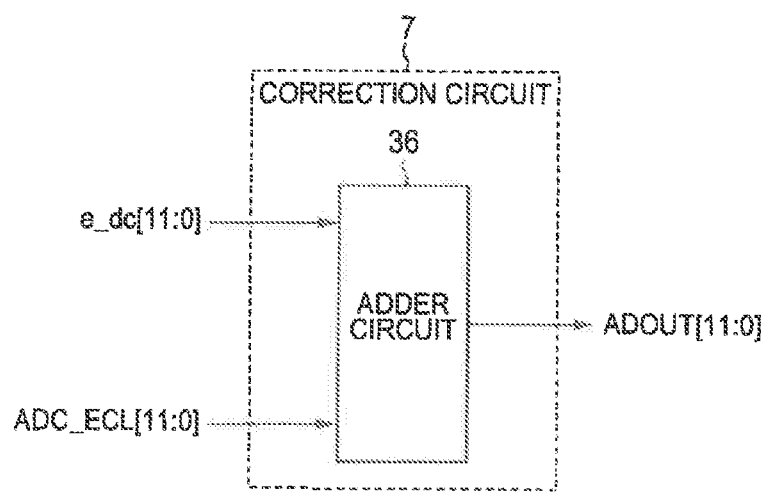
FIG. 28 is a block diagram for showing a configuration example of a correction circuit according to the fifth embodiment.
Figure 29:
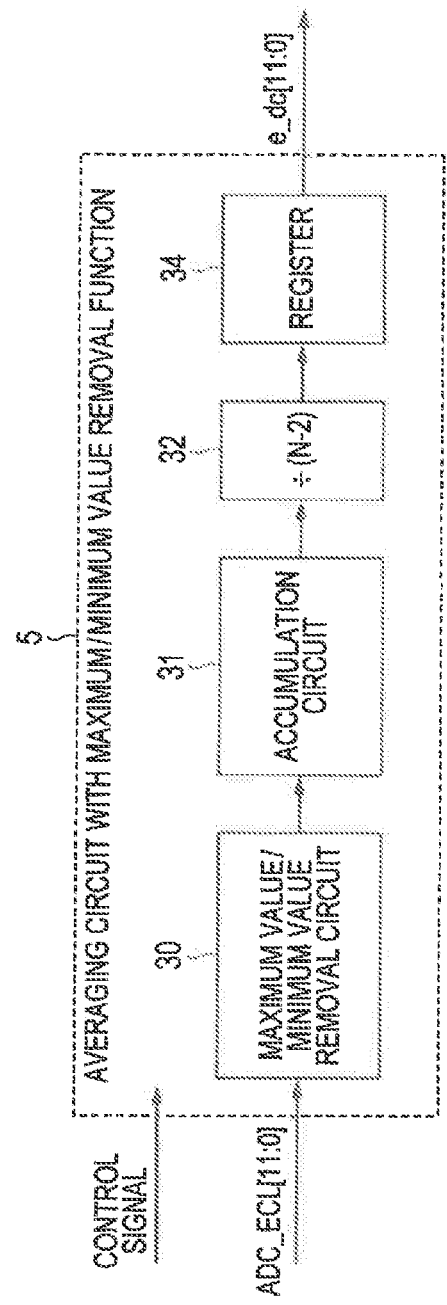
FIG. 29 is a block diagram for showing a configuration example of an averaging circuit having a maximum value/minimum value removal function according to the fifth embodiment.

The calibration circuit 3 is configured using the correction circuit 7 and the averaging circuit 5. As shown in FIG. 28, the correction circuit 5 adds an output ADC_ECL[11:0] of the error correction logic (ECL) 2 to an offset correction value e_dc[11:0] to be output as a conversion output ADOUT[11:0]. As shown in FIG. 29, the averaging circuit 5 is a circuit similar to the averaging circuit of FIG. 10, and removes the maximum value and the minimum value from the outputs ADC_ECL[11:0] during the calibration period to be accumulated by the accumulation circuit 31. Thereafter, the averaging circuit 5 stores into the register 34 the average value obtained by being divided by N−2 by the division circuit 32 as the offset correction value e_dc[11:0]. The averaging circuit 5 may be changed to a circuit similar to the averaging circuit shown in each of FIG. 22 to FIG. 26.

An offset calibration operation will be described.

Figure 31:
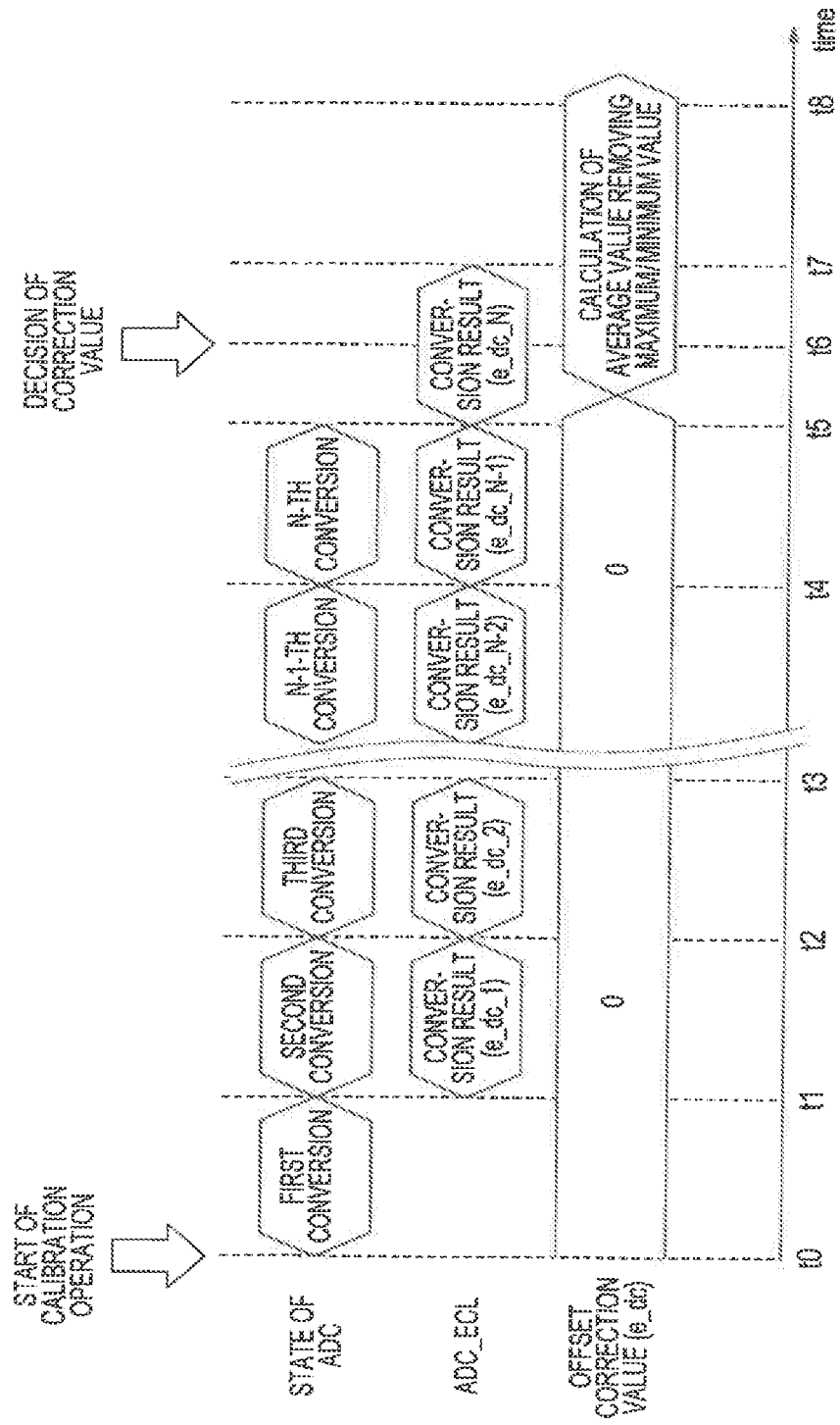
FIG. 31 is a timing chart for showing an operation example of the offset calibration.

FIG. 31 is a timing chart for showing an operation example of the offset calibration.

Figure 30:
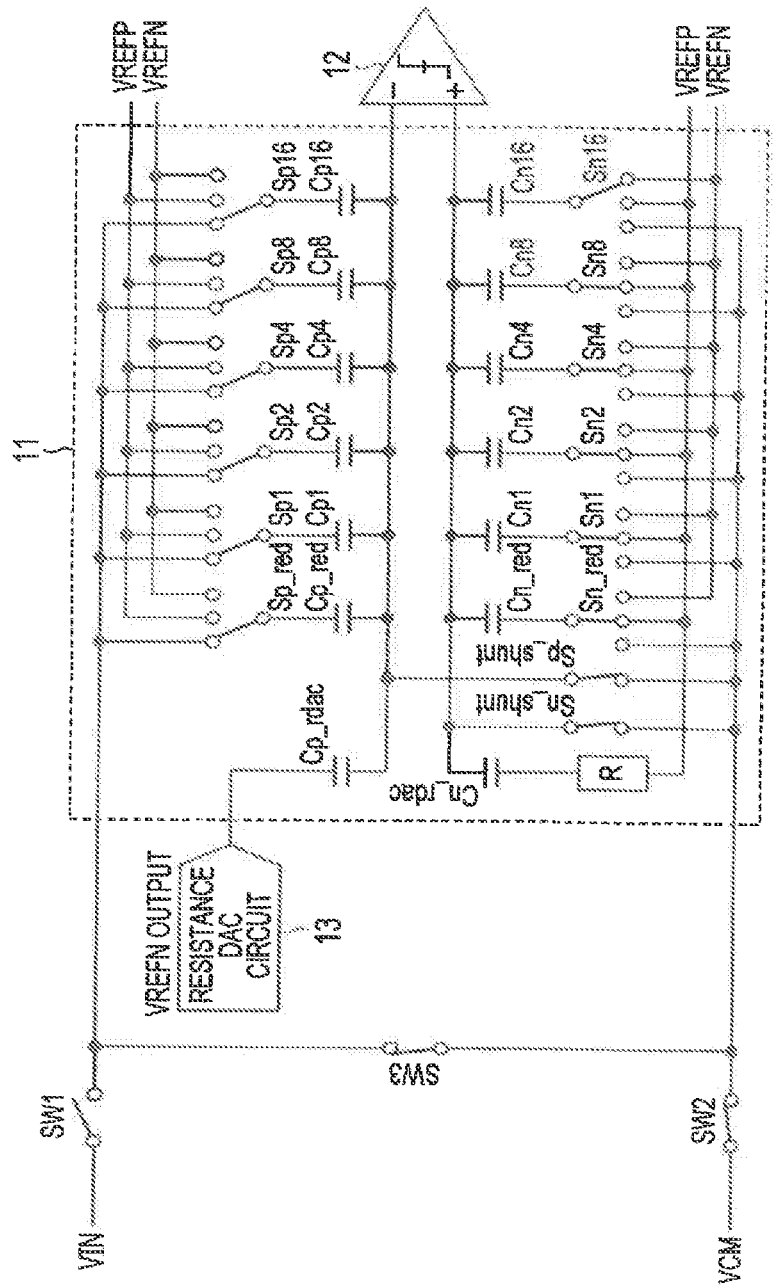
FIG. 30 is a circuit diagram for showing the states of switches in the capacitance DAC circuit in a sampling state in an offset calibration operation.

The circuit diagram of FIG. 30 shows the states of the switches SW1, SW2, and SW3, the states of the switches in the capacitance DAC circuit 11, and the output state of the resistance DAC circuit 13 in a sampling state in the offset calibration operation. When the switch SW1 is opened and the switches SW2 and SW3 are closed, the standard voltage VCM is input into not only the input of the capacitance DAC circuit 11 on the VCM side but also the input on the VIN side. The capacitors Cp16, Cp8, Cp4, Cp2, Cp1, and Cp_red are coupled to the VIN side of the capacitance DAC circuit 11 through the switches Sp16, Sp8, Sp4, Sp2, Sp1, and Sp_red in the capacitance DAC circuit 11, and the standard voltage VCM is applied. The VREFN output from the resistance DAC circuit 13 is applied to the capacitor Cp_rdac. The electric charges sampled in this state are A/D-converted, and thus offset errors can be obtained. Namely, the offset correction value e_dc[11:0] can be obtained.

As shown in FIG. 31, the sampling and the A/D conversion are repeated a plurality of times (for example, N times), so that N conversion results e_dc_1 to e_dc_N can be obtained in the ADC_ECL[11:0], and the average value of the remaining N−2 conversion results obtained by removing the maximum value and the minimum value is calculated to obtain the final offset correction value e_dc[11:0].

In the normal operation, the calculated offset correction value e_dc[11:0] is added to the ADC_ECL[11:0] by the correction circuit 7 shown in FIG. 28, and the result is output. Accordingly, the offset in the characteristics of the ADOUT[11:0] is corrected.

[Sixth Embodiment] Mismatch Correction Calibration and Offset Calibration

Both of the capacitance mismatch and the offset errors of the capacitance DAC circuit 11 can be calibrated by combining the mismatch correction calibration according to the first to fourth embodiments and the offset calibration according to the fifth embodiment.

Figure 32:
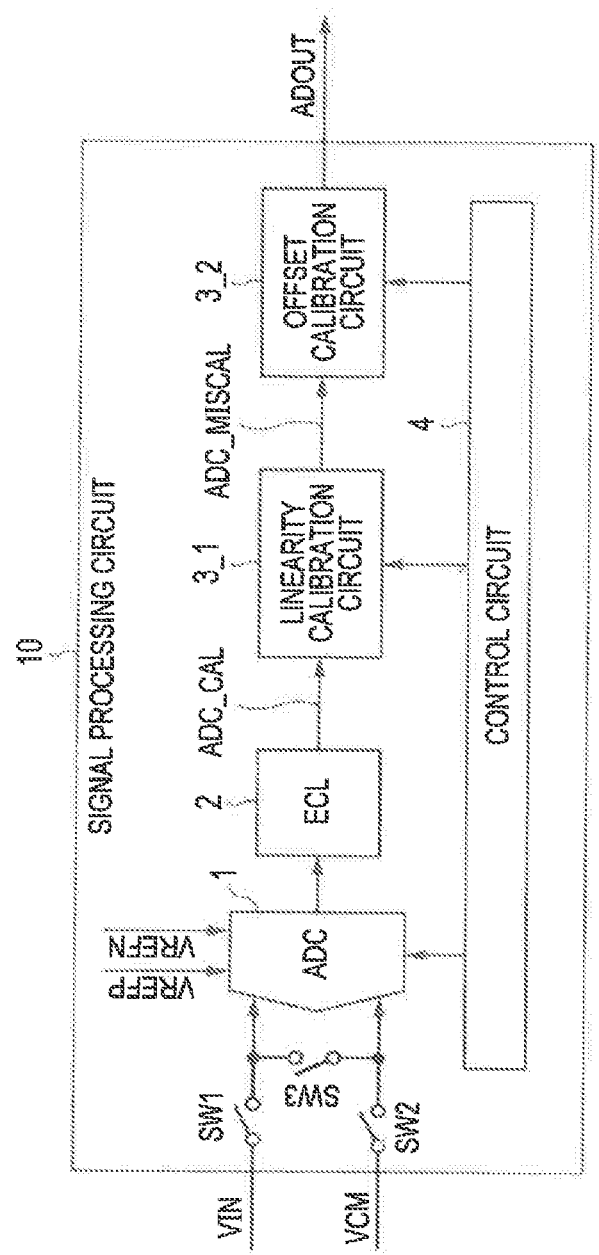
FIG. 32 is a block diagram for showing a configuration example of an AD convertor to which both of a capacitance mismatch calibration circuit and an offset calibration circuit are coupled in a signal processing circuit according to a sixth embodiment.

FIG. 32 is a block diagram for showing a configuration example of an AD convertor to which both of a capacitance mismatch calibration circuit and an offset calibration circuit are coupled in a signal processing circuit 10 according to a sixth embodiment. The signal processing circuit 10 includes the ADC 1, the ECL 2, a linearity calibration circuit 3_1, an offset calibration circuit 3_2, and the control circuit 4, and further includes the switch SW1 on a route from the input voltage VIN to the ADC 1, the switch SW2 on a route from the standard voltage VCM to the ADC 1, and the switch SW3 between the input terminals of the input voltage VIN and the standard voltage VCM of the ADC 1, as similar to the fifth embodiment. As shown in FIG. 32, the linearity calibration circuit 3_1 is arranged in the preceding stage of the offset calibration circuit 3_2, and the linearity calibration is performed first, so that the offset errors in the subsequent stage can be more accurately corrected.

An operation of the signal processing circuit 10 according to the sixth embodiment will be described.

Figure 33:
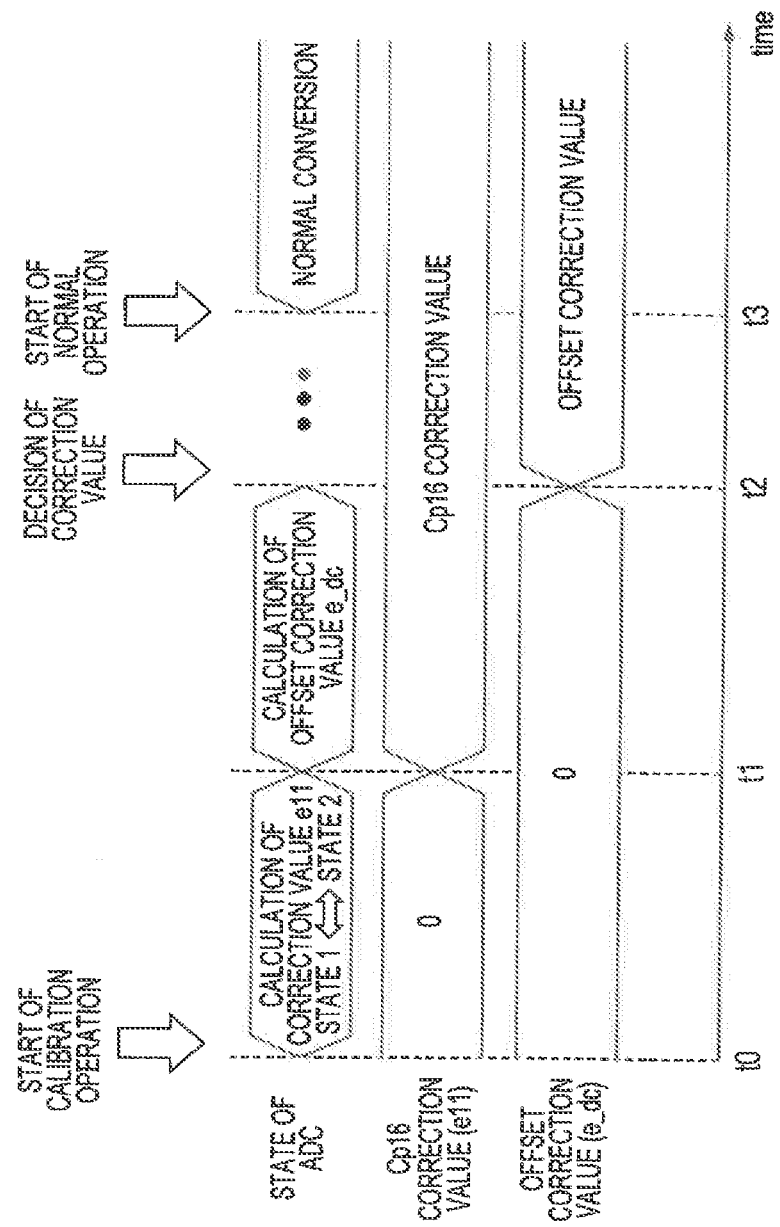
FIG. 33 is a timing chart for showing an operation example of calibration of the signal processing circuit according to the sixth embodiment.

FIG. 33 is a timing chart for showing an operation example of calibration of the signal processing circuit 10. When the calibration operation is started at Time t0, the switches SW1 and SW2 are closed and the switch SW3 is opened first, and the correction value e11[11:0] of the Cp16 is calculated as similar to the description of the first embodiment. Next, the switches SW1, SW2, and SW3 are controlled as similar to the description of the fifth embodiment to calculate the offset correction value e_dc[11:0]. In the normal operation after Time t3, the linearity is corrected using the calculated correction value e11[11:0] of the Cp16, and the offset value of the offset correction value e_dc[11:0] is corrected.

Figure 34:
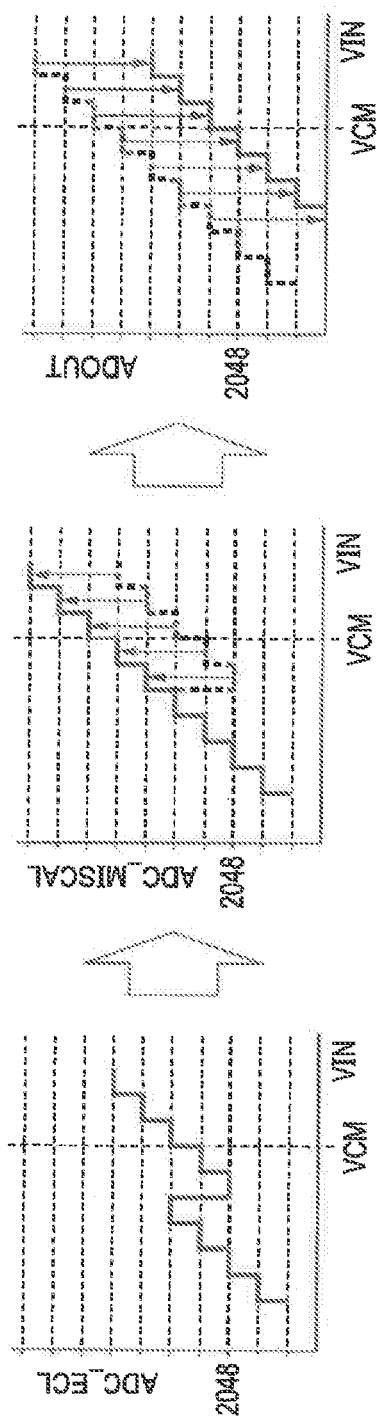
FIG. 34 is an explanatory diagram for showing an operation example of the calibration of the sixth embodiment.

FIG. 34 is an explanatory diagram for showing an operation example of the calibration. In the case where a relation between the input voltage VIN of the signal processing circuit 10 and the output ADC_ECL[11:0] of the error correction logic 2 is as shown in the left graph, the linearity is corrected using the correction value e11[11:0] of the Cp16 first, so that a relation between the input voltage VIN and the output ADC_MISCAL[11:0] of the linearity calibration circuit 3_1 is corrected as shown in the middle graph. Each of the arrows shown in the middle graph represents the correction value e11[11:0] of the Cp16. Next, the offset errors are corrected using the offset correction value e_dc[11:0], so that a relation between the input voltage VIN and the conversion output ADOUT[11:0] is corrected as shown in the right graph. Each of the arrows shown in the right graph represents the offset correction value e_dc[11:0].

The linearity calibration circuit 3_1 may be any one of the calibration circuits shown in the first to fourth embodiments. For example, the linearity calibration circuit 3_1 may be changed to a linearity calibration circuit by which a plurality of bits is calibrated. Further, the correction values excluded from the averaging targets may be one maximum value and one minimum value, or some large and small values. Further, a limiter may be added as described in the fourth embodiment.

[Seventh Embodiment] Pipeline-Type AD Convertor

In the first to sixth embodiments, an application example to the sequential comparison-type AD conversion circuit has been mainly described. However, the present invention can be applied to an AD conversion circuit of a different system. In a seventh embodiment, an application example to an AD conversion circuit of a pipeline system will be described.

Figure 35:
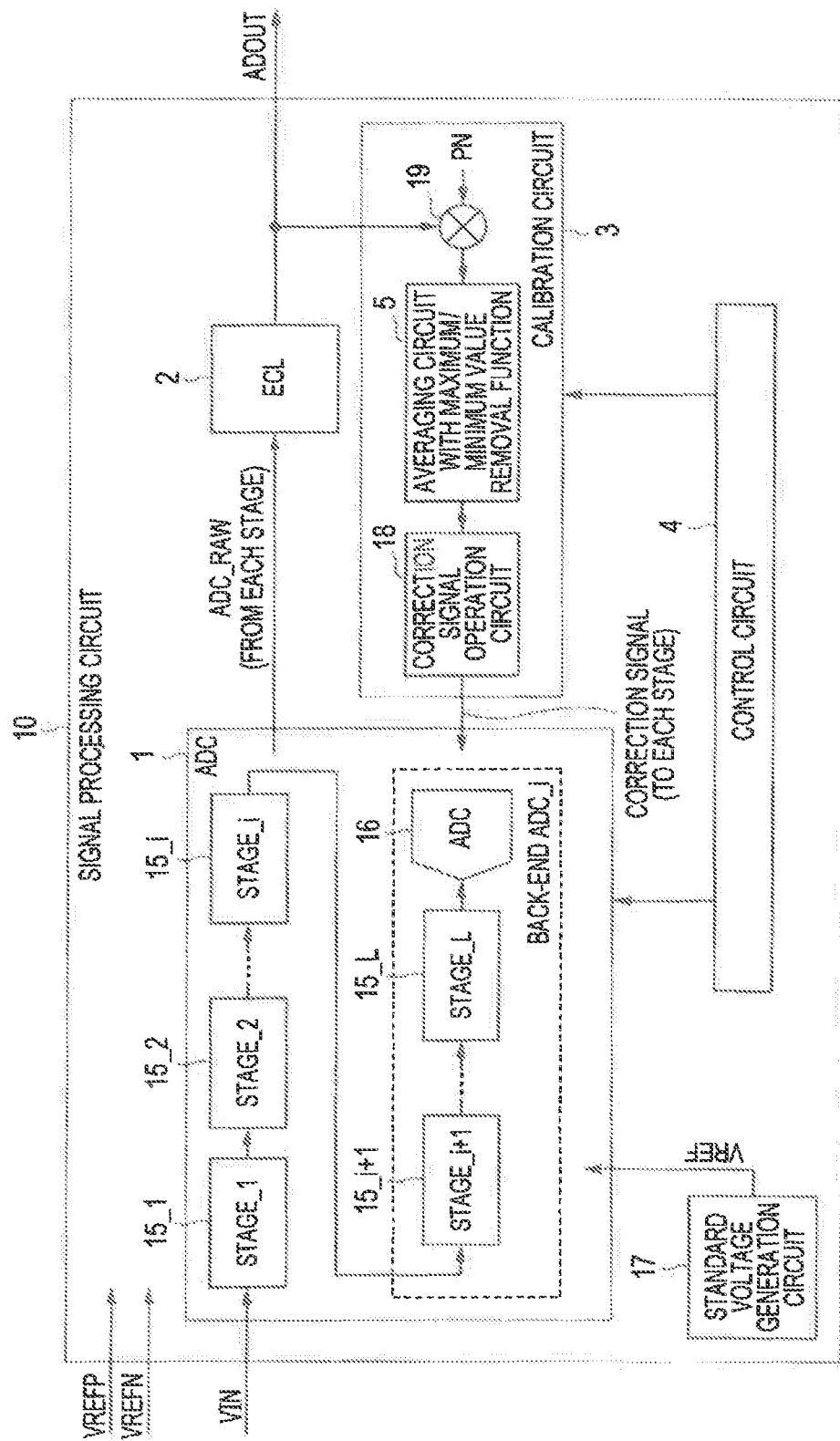
FIG. 35 is a block diagram for showing a configuration example of an AD conversion circuit of a pipeline system.

FIG. 35 is a block diagram for showing a configuration example of a signal processing circuit 10 in which a calibration circuit 3 is added to an AD convertor (ADC) 1 of a pipeline system. The signal processing circuit 10 includes the ADC 1, the error correction logic (ECL) 2, the calibration circuit 3, the control circuit 4, and a standard voltage generation circuit 17.

The ADC 1 is an AD convertor of a pipeline system including L (L is an integer equal to or larger than 2) stages (STAGE_1 to STAGE_L) 15_1 to 15_L and an ADC 16 in the final stage. A back-end ADC_i is formed by combining stages (STAGE_i+1 to STAGE_L) 15_i+1 to 15_L subsequent to an i-th stage (STAGE_i) 15_i and the ADC 16 in the final stage. The ADC 16 in the final stage is an ADC having a resolution of 2 to 3 bits.

The ECL 2 generates a conversion output ADOUT as the entire signal processing circuit 10 on the basis of an output from each stage of the ADC 1 and an output ADC_RAW from the ADC in the final stage. The standard voltage generation circuit 17 generates a reference voltage VREF to be supplied to the ADC 1. The control circuit 4 controls a pipeline operation of the ADC 1 and an operation of the calibration circuit 3. The calibration circuit 3 includes a multiplying circuit 19 that multiplies a conversion output ADOUT by PN=±1, an averaging circuit 5, and a correction signal operation circuit 18 that calculates a correction coefficient of each stage on the basis of the correction value output from the averaging circuit 5 to be supplied to each stage as a correction signal. In this case, PN is a constant that defines the polarity in accordance with a state 1 and a state 2 to be described later. In the state 1, PN is +1. In the state 2, PN is −1 that means the reverse polarity. It should be noted that the averaging circuit 5 may have a circuit configuration similar to the averaging circuit described in each of the first to fourth embodiments.

Figure 36:
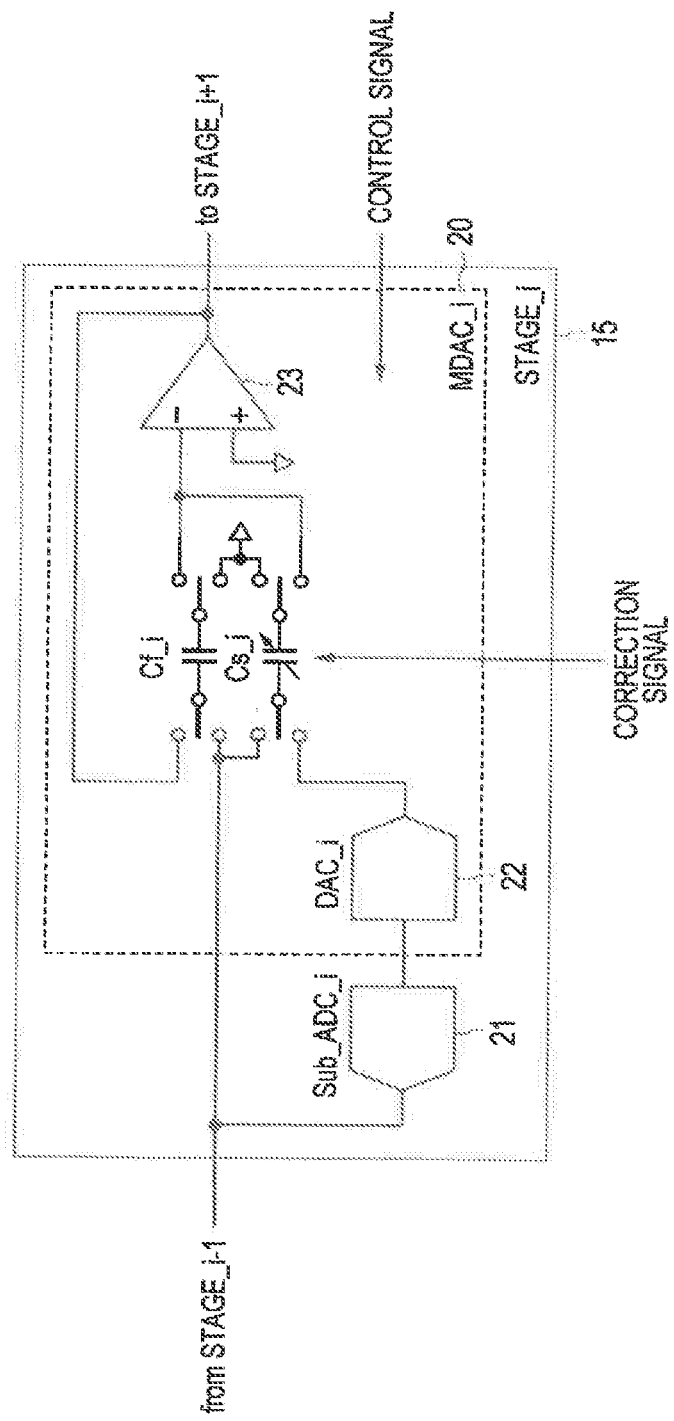
FIG. 36 is a block diagram for showing a configuration example of each stage of the AD conversion circuit of a pipeline system.

FIG. 36 is a block diagram for showing a configuration example of each stage of the ADC 1. The i-th stage (STAGE_i) 15_i will be described. The i-th stage (STAGE_i) 15_i is configured using a Sub_ADC_i21 that A/D-converts an output of an i-1-th stage (STAGE_i-1) 15_i-1 of the preceding stage, and an MDAC_i (20) that gives offset in accordance with a conversion result of the Sub_ADC_i (21) to an output of the i-1-th stage (STAGE_i-1) 15_i-1 of the preceding stage while multiplying A times and outputs the result. The amplification factor A is usually 2. The MDAC_i(20) includes an operation amplifier 23; a switched capacitor amplifier having a fixed capacitor Cf_i, a variable capacitor Cs_i, and switches coupling these capacitors; and a D/A convertor DAC_i (22). The variable capacitor Cs_i can finely adjust the correction by the calibration in accordance with a correction signal.

An operation of the signal processing circuit 10 will be described.

In the pipeline-type A/D convertor, a relative error between the capacitance values of the fixed capacitor Cf_i and the variable capacitor Cs_i (I=1~L) in the MDAC_i (20) of each stage is largely related to the accuracy of conversion as the A/D convertor. Accordingly, the signal processing circuit 10 performs calibration in which a correction signal to finely adjust the variable capacitor Cs_i is determined so that Cf_i=Cs_i is satisfied in each stage.

Figure 37:
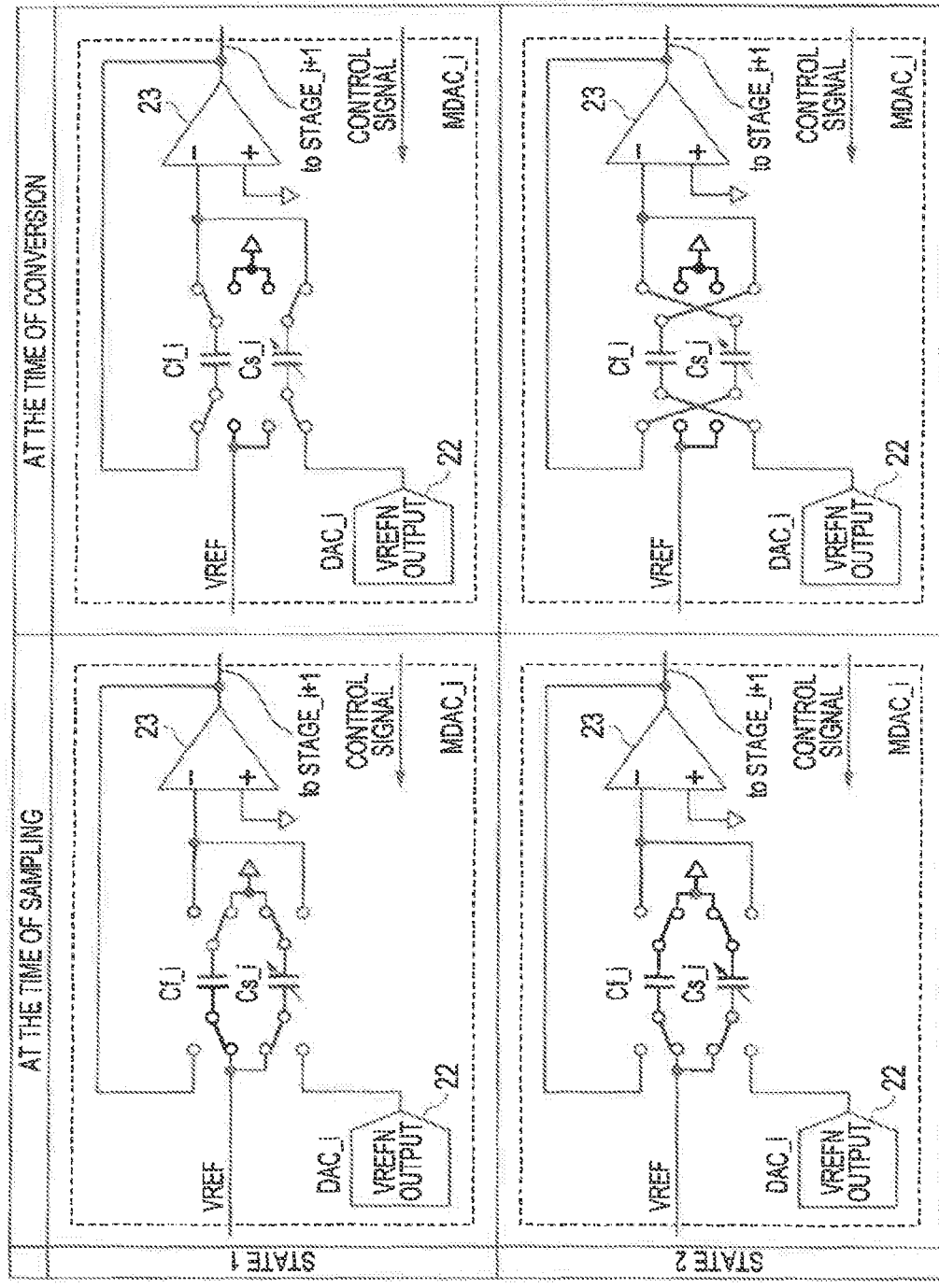
FIG. 37 is an explanatory diagram for showing the states of switches of each stage in a calibration operation of a seventh embodiment.

In the calibration operation of the i-th stage (STAGE_i) 15_i, the VREF instead of an input from the preceding stage is input from the standard voltage generation circuit 17. In response to this, the sampling and conversion in the state 1 and the sampling and conversion in the state 2 are alternately executed, and the A/D conversion at this time is performed by the back-end ADC_i in the stage subsequent to the i-th stage (STAGE_i). FIG. 37 is an explanatory diagram for showing the states of the switches at the time of the sampling and conversion in each of the state 1 and the state 2 of the calibration operation. In the sampling, the fixed capacitor Cf_i and the variable capacitor Cs_i are coupled to the ground level and the VREF in each of the state 1 and the state 2, and electricity is charged to the VREF. In the conversion, the fixed capacitor Cf_i functions as a feedback capacitor of the operation amplifier 23, and the variable capacitor Cs_i functions as an input capacitor from the D/A convertor DAC_i (22) to the operation amplifier 23 in the state 1. On the contrary, the variable capacitor Cs_i functions as a feedback capacitor, and the fixed capacitor Cf_i functions as an input capacitor in the state 2.

In the calibration operation of the i-th stage (STAGE_i) 15_i, the sampling and conversion in the state 1 and the sampling and conversion in the state 2 are alternately executed. The conversion output in the state 1 and the conversion output in the state 2 are converted into digital values by the back-end ADC_i, and are input into the calibration circuit 3 through the ECL 2.

The principle of the calibration will be described.

It is assumed that a relative error between the fixed capacitor Cf_i and the variable capacitor Cs_i is $\alpha$ and Cs_i=(1+$\alpha$) Cf_i is satisfied.

On the assumption that an output of the MDAC_i in the state 1 is Vout_i1 and an output of the MDAC_i in the state 2 is Vout_i2, Vout_i1−Vout_i2=2$\alpha$ (VREF−VREFN) is satisfied. On the basis of the values of the Vout_i1, Vout_i2, VREF, and VREFN, $\alpha$ can be obtained, and the level of the correction signal to be supplied to the variable capacitor Cs_i is determined on the basis of the values.

The Vout_i1 and Vout_i2 are output from the i-th stage (STAGE_i) 15_i in the state 1 and the state 2, and thus are converted into digital values using the back-end ADC_i in the subsequent stage to be input into the calibration circuit 3 through the ECL 2. The value of the VREF supplied from the standard voltage generation circuit 17 and the value of the VREFN output from the D/A convertor DAC_i (22) are already known because they are defined in the design stage, and the calibration circuit 3 can calculate the value of $\alpha$ on the basis of these values. The state 1 and the state 2 are alternately repeated a plurality of times (N times), so that N pieces of $\alpha$ can be calculated. The N pieces of $\alpha$ are input to the averaging circuit 5 as N correction values, and are averaged after removing the maximum value and the minimum value to be supplied to the correction signal operation circuit 18 as the final correction value. The effect of unexpected noise can be removed by removing the maximum value and the minimum value. The correction values excluded from the averaging targets may be one maximum value and one minimum value, or some large and small values. Further, a limiter may be added as described in the fourth embodiment.

Accordingly, even in the calibration operation in which each stage of the pipeline-type AD convertor is corrected, when a large error is included in the correction value due to unexpected external noise and the like, a more accurate correction value (correction signal) can be calculated by removing the effect.

The invention achieved by the inventors has been described above in detail on the basis of the embodiments. However, it is obvious that the present invention is not limited to the embodiments, but can be variously changed without departing from the scope of the invention.

For example, the resolution of each of the ADC and the DAC, the position of the redundant bit, the number of pipeline stages, and the like exemplified in each embodiment can be appropriately changed or set.

What is claimed is:

1. An analog-to-digital (AD) convertor, comprising:
an AD conversion circuit; and
a correction circuit that corrects an output value of the AD conversion circuit based on a correction value,
wherein the correction circuit generates a plurality of elemental correction values based on a plurality of output values which are converted values of a plurality of analog values by the AD conversion circuit,
wherein the correction value is determined by an average value of remaining values obtained by removing a deviated value from the plurality of elemental correction values.

2. The AD converter according to claim 1, wherein the deviated value includes at least one of a maximum value and a minimum value of the plurality of elemental correction values.

3. The AD converter according to claim 2, wherein the deviated value further includes at least one of a predetermined upper limit value and a predetermined lower limit value.

4. The AD converter according to claim 1, wherein the deviated value includes a predetermined range of values for the plurality of elemental correction values.

5. The AD converter according to claim 4, wherein the predetermined range of values includes at least one of top N values and low M values (N, M: an integer value greater than or equal to 2).

6. A calibration method of an analog-to-digital (AD) converter, comprising:
generating a plurality of elemental correction values based on a plurality of output values which are converted values of a plurality of analog values by the AD converter;
generating a correction value by an average value of remaining values obtained by removing a deviated value from the plurality of elemental correction values; and
correcting an output value of the AD converter based on the correction value.

7. The calibration method of the AD converter according to claim 6, wherein the deviated value includes at least one of a maximum value and a minimum value of the plurality of elemental correction values.

8. The calibration method of the AD converter according to claim 7, wherein the deviated value further includes at least one of a predetermined upper limit value and a predetermined lower limit value.

9. The calibration method of the AD converter according to claim 6, wherein the deviated value includes a predetermined range of values for the plurality of elemental correction values.

10. The calibration method of the AD converter according to claim 9, wherein the predetermined range of values includes at least one of top N values and low M values (N, M: an integer value greater than or equal to 2).

* * * * *